(12) United States Patent
Chiba

(10) Patent No.: US 10,868,152 B2
(45) Date of Patent: Dec. 15, 2020

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Akira Chiba, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/153,856

(22) Filed: Oct. 8, 2018

(65) Prior Publication Data

US 2019/0115454 A1 Apr. 18, 2019

(30) Foreign Application Priority Data

Oct. 12, 2017 (JP) .............................. JP2017-198624

(51) Int. Cl.
| | |
|---|---|
| *H01L 29/66* | (2006.01) |
| *H01L 21/311* | (2006.01) |
| *H01L 29/423* | (2006.01) |
| *H01L 27/11521* | (2017.01) |
| *H01L 21/28* | (2006.01) |
| *H01L 21/02* | (2006.01) |

(52) U.S. Cl.
CPC .. *H01L 29/66825* (2013.01); *H01L 21/31111* (2013.01); *H01L 27/11521* (2013.01); *H01L 29/40114* (2019.08); *H01L 29/42324* (2013.01); *H01L 29/42328* (2013.01); *H01L 21/02263* (2013.01)

(58) Field of Classification Search
CPC ......... H01L 29/66825; H01L 29/40114; H01L 21/31111; H01L 27/11521; H01L 29/42324; H01L 21/02263
See application file for complete search history.

(56) References Cited

U.S. PATENT DOCUMENTS

| | | | | | |
|---|---|---|---|---|---|
| 5,572,054 | A | * | 11/1996 | Wang | G11C 16/0425 |
| | | | | | 257/322 |
| 2002/0146886 | A1 | * | 10/2002 | Chern | H01L 27/115 |
| | | | | | 438/295 |
| 2009/0085092 | A1 | * | 4/2009 | Nagai | H01L 27/11521 |
| | | | | | 257/316 |
| 2009/0096015 | A1 | * | 4/2009 | Io | H01L 27/115 |
| | | | | | 257/324 |

(Continued)

FOREIGN PATENT DOCUMENTS

JP         2008251825 A     10/2008

*Primary Examiner* — Fernando L Toledo
*Assistant Examiner* — Neil R Prasad
(74) *Attorney, Agent, or Firm* — Volentine, Whitt & Francos, PLLC

(57) ABSTRACT

A semiconductor device including a memory cell, the semiconductor device including: a floating gate provided at a semiconductor substrate with a first insulation film inbetween, and including a pointed portion having a pointed end at one end side; a spacer provided at the floating gate; a second insulation film provided between the floating gate and the spacer and that covers a side surface of the spacer at the one end side; and a control gate that contacts a side surface of the floating gate at the one end side via a third insulation film and that contacts the side surface of the spacer at the one end side via the second insulation film and the third insulation film.

10 Claims, 27 Drawing Sheets

(56) References Cited

U.S. PATENT DOCUMENTS

2011/0049605 A1\* 3/2011 Ishiguro ............ H01L 21/28132
    257/316
2017/0062448 A1\* 3/2017 Kitajima ........... H01L 27/11524

\* cited by examiner

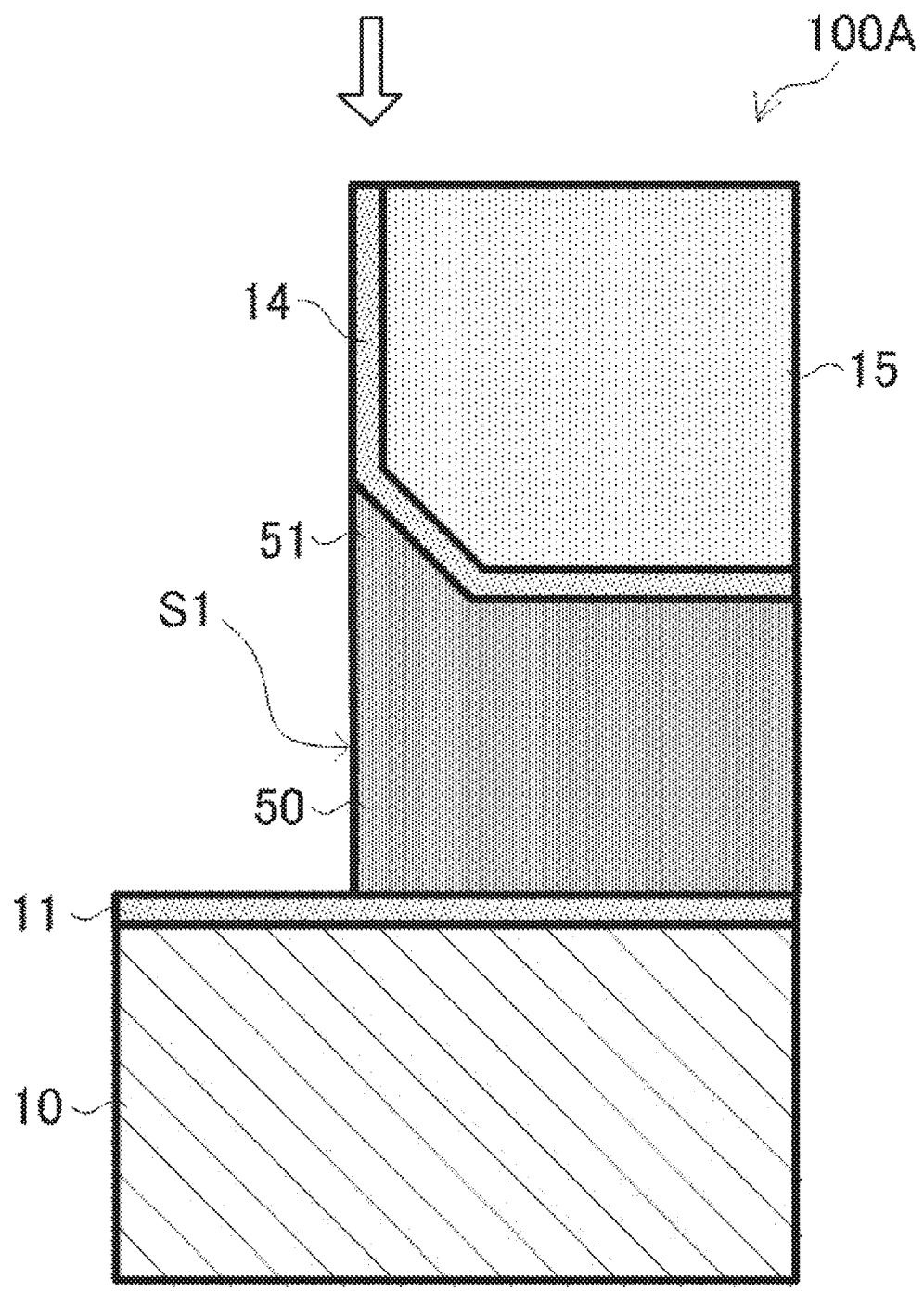

SEMICONDUCTOR DEVICE AND SEMICONDUCTOR DEVICE MANUFACTURING METHOD

CROSS-REFERENCE TO RELATED APPLICATION

This application claims priority under 35 USC 119 from Japanese Patent Application No. 2017-198624, filed on Oct. 12, 2017, the disclosure of which is incorporated by reference herein.

BACKGROUND

Technical Field

The present invention relates to a semiconductor device and a semiconductor device manufacturing method.

Related Art

A split-gate semiconductor memory is known as an electrically programmable read-only memory (EEPROM).

For example, Japanese Patent Application Laid-Open (JP-A) No. 2008-251825 discloses a semiconductor device manufacturing method including: forming a conductive material layer for a floating gate on a semiconductor layer with a gate insulation film in between; forming a first spacer consisting of a first silicon dioxide film, and a second spacer adjacent to the first spacer, consisting of a second silicon dioxide film and having an etching rate lower than an etching rate of the first silicon dioxide film; selectively removing the conductive material layer by using the first spacer and the second spacer as masks; removing the first spacer to expose a portion of the conductive material layer; and forming a control gate to face the portion of the conductive material layer exposed via a tunnel insulation film.

In a split-gate memory cell, a spacer formed of an insulating material is used to form, in a self-aligned manner with respect to the floating gate, the control gate that functions as a word wire. The spacer is layered on the floating gate and is used for patterning of the floating gate. Manufacturing steps of the split-gate memory cell includes, for example, the following steps.

A polysilicon film that configures the floating gate is formed at a semiconductor substrate with a gate insulation film thereinbetween. Next, a nitride film is formed at a surface of the polysilicon film. Next, an opening is formed at an expected position on the nitride film for forming the floating gate and the spacer, and the polysilicon film is exposed through the opening. Next, a surface of the exposed portion of the polysilicon film is etched. Accordingly, a concave portion is formed at the surface of the polysilicon film. Next, an insulation film such as $SiO_2$ configuring the spacer is formed to cover side surface of the opening of the nitride film and the exposed portion of the polysilicon film. Next, the insulation film is etched back to form the spacer. A source and source wiring are formed in a self-aligned manner with respect to the spacers, and then the nitride film is removed by etching. Next, the polysilicon film is etched with the spacer used as the mask to perform patterning of the polysilicon film. Accordingly, the floating gate is formed. A pointed portion is formed at an end portion of the floating gate by formation of a concave portion in the polysilicon film in the previous step. Next, the tunnel insulation film is formed to cover the floating gate and the exposed portion of the spacer. Next, the polysilicon film configuring the control gate is formed on a surface of the tunnel insulation film. Next, the control gate is formed by patterning the polysilicon film.

In the memory cell described above, the floating gate and the control gate are insulated by the tunnel insulation film. When writing data "0" in the above-described memory cell, electrons are injected into the floating gate and causes the electrons to be accumulated in the floating gate. On the other hand, when the data "0" written in the memory cell descried above is rewritten to data "1", the electrons accumulated in the floating gate are extracted to the control gate. Since concentration of electric field occurs at the pointed portion due to the floating gate having the pointed portion, rewriting to data "1" may be performed with a relatively low voltage. Note that a state in which electrons are accumulated in the floating gate may be expressed as data "1" and a state in which electrons are not accumulated in the floating gate may be expressed as data "0".

In the semiconductor memory manufacturing steps described above, the film thickness at the portion of the tunnel insulation film covering the pointed portion of the floating gate may be reduced or the film quality may deteriorate, due to etching of a side surface of the spacer during etching for removing the nitride film. Accordingly, electrons accumulated at the floating gate may be extracted to the control gate and the data stored in the memory cell may be rewritten.

SUMMARY

The present disclosure provides a semiconductor device and a semiconductor device manufacturing method that may prevent data deterioration in a memory cell by preventing etching of a side surface of a spacer.

A first aspect of the present disclosure is a semiconductor device including a memory cell, the semiconductor device including: a floating gate provided at a semiconductor substrate with a first insulation film inbetween, and including a pointed portion having a pointed end at one end side; a spacer provided at the floating gate; a second insulation film provided between the floating gate and the spacer and that covers a side surface of the spacer at the one end side; and a control gate that contacts a side surface of the floating gate at the one end side via a third insulation film and that contacts the side surface of the spacer at the one end side via the second insulation film and the third insulation film.

A second aspect of the present disclosure is a semiconductor device manufacturing method including: forming a gate member at a surface of a semiconductor substrate with a first insulation film in between; forming a mask member including an opening at a surface of the gate member, the opening exposing a portion of the gate member; forming a second insulation film at a side surface of the opening and the surface of the gate member exposed through the opening; forming a spacer inside the opening, the spacer being in contact with the side surface of the opening and the surface of the gate member via the second insulation film; removing the mask member by etching; and forming a floating gate by etching the gate member using the spacer and the second insulation film as masks, wherein the second insulation film has a higher resistance against etchant used for etching of the mask member than the spacer.

According to the above aspects, a semiconductor device and a semiconductor device manufacturing method of the present disclosure may prevent etching of a side surface of a spacer, and thus, may prevent data deterioration in a memory cell.

BRIEF DESCRIPTION OF THE DRAWINGS

Exemplary embodiments will be described in detail based on the following figures, wherein:

FIG. 10A to FIG. 10D are partial cross-sectional views illustrating a memory cell manufacturing steps according to the another exemplary embodiment of the disclosure.

DETAILED DESCRIPTION

With reference to the drawings, an exemplary embodiment of the disclosure will be described below. The same or equivalent components and portions in the respective drawings are denoted by the same reference numbers, and description thereof will be omitted if appropriate.

First Exemplary Embodiment

Figure 1:
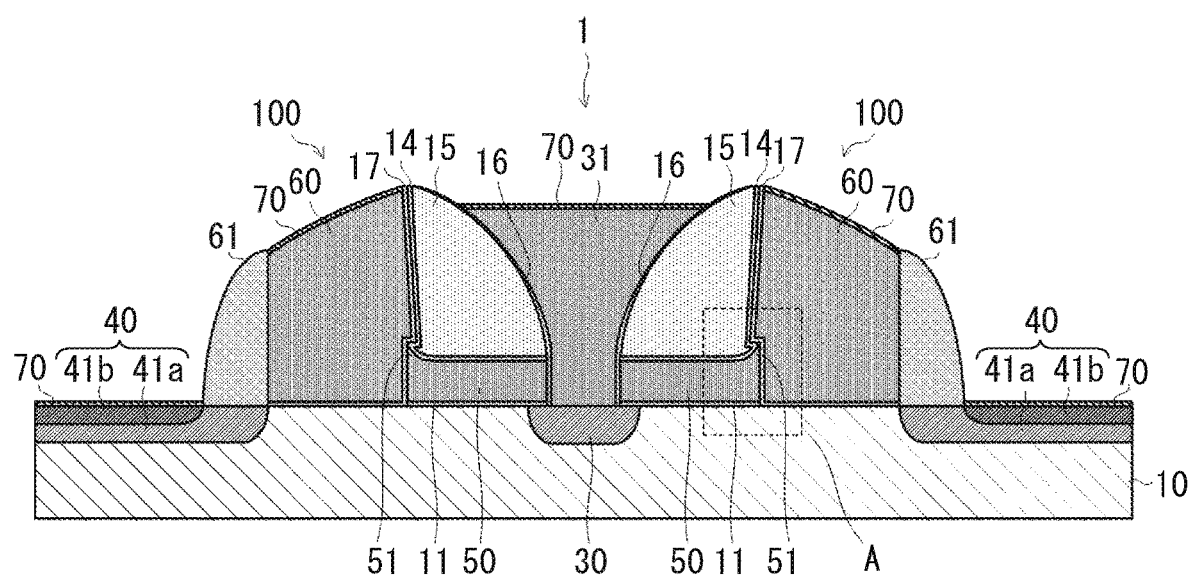
FIG. 1 is a cross-sectional view illustrating a configuration of a semiconductor device according to an exemplary embodiment of the present disclosure.

FIG. 1 is a cross-sectional view illustrating a configuration of a semiconductor device 1 according to a first exemplary embodiment of the disclosure. The semiconductor device 1 includes plural memory cell arrays, each including two split-gate memory cells 100. The two split-gate memory cells 100 share a source diffusion layer 30 and a source wiring 31, and are respectively disposed symmetrically about the source diffusion layer 30 and the source wiring 31 interposed in between.

Each of the memory cells 100 includes the source diffusion layer 30 and a drain diffusion layer 40 placed separately from each other in a surface of a semiconductor substrate 10. Further, each of the memory cells 100 includes a floating gate 50 and a control gate 60 provided on a surface of the semiconductor substrate 10 at an area between the source diffusion layer 30 and the drain diffusion layer 40. The semiconductor substrate 10 is formed of a material containing, for example, a monocrystalline silicon.

A gate insulation film 11 is provided between the floating gate 50 and the semiconductor substrate 10. The floating gate 50 is formed of a material containing, for example, polysilicon, and includes a pointed portion 51 having a pointed end at an end portion at a side closer to the drain diffusion layer 40. The end of the pointed portion 51 forms an edge in a depth direction (the viewing direction of FIG. 1). The side does not depend on crystalline grains of polysilicon that forms the floating gate 50.

A spacer 15 is provided at an upper surface of the floating gate 50 with a protective oxidized film 14 inbetween. The spacer 15 is used for forming the control gate 60 in a self-aligned manner with respect to the floating gate 50. Further, the spacer 15 is used as a mask when patterning the floating gate 50. The protective oxidized film 14 is provided between the floating gate 50 and the spacer 15, and covers a side surface of the spacer 15 at the side closer to the drain diffusion layer 40. The spacer 15 is consisting of, for example, an insulating material ($SiO_2$) such as a None-doped Silicate Glass (NSG) film.

The protective oxidized film 14 is a silicon dioxide film containing $SiO_2$ and has a film thickness of, for example, 5 nm. The protective oxidized film 14 has a density that is higher than a density of the spacer 15, and has a higher resistance against etchant for etching a nitride film 13 (see FIG. 3A) than the spacer 15. By the protective oxidized film 14 covering a side surface of the spacer 15, etching of the side surface of the spacer 15 is prevented in an etching process for removing the nitride film 13. Heat treatment is performed after formation of the protective oxidized film 14 to provide the protective oxidized film 14 with high denseness. The film thickness of the protective oxidized film 14 is 10 nm or smaller to densify the entire protective oxidized film 14.

In the present exemplary embodiment, the side surface of the spacer 15 at the drain diffusion layer 40 side (hereinafter, referred to simply as "side surface of the spacer 15") has an inverse tapered shape that incline toward the drain diffusion layer 40 with respect to a main surface of the semiconductor substrate 10. Therefore, the pointed portion 51 of the floating gate 50 projects toward the drain diffusion layer 40 with respect to the side surface of the spacer 15. In the memory cells 100 according to the present exemplary embodiment, a surface of the protective oxidized film 14 covering the side surface of the spacer 15, and a side surface of the floating gate 50 at the drain diffusion layer 40 side (hereinafter, referred to simply as "side surface of the floating gate 50"), extend in planes that are different from each other.

Figure 2:
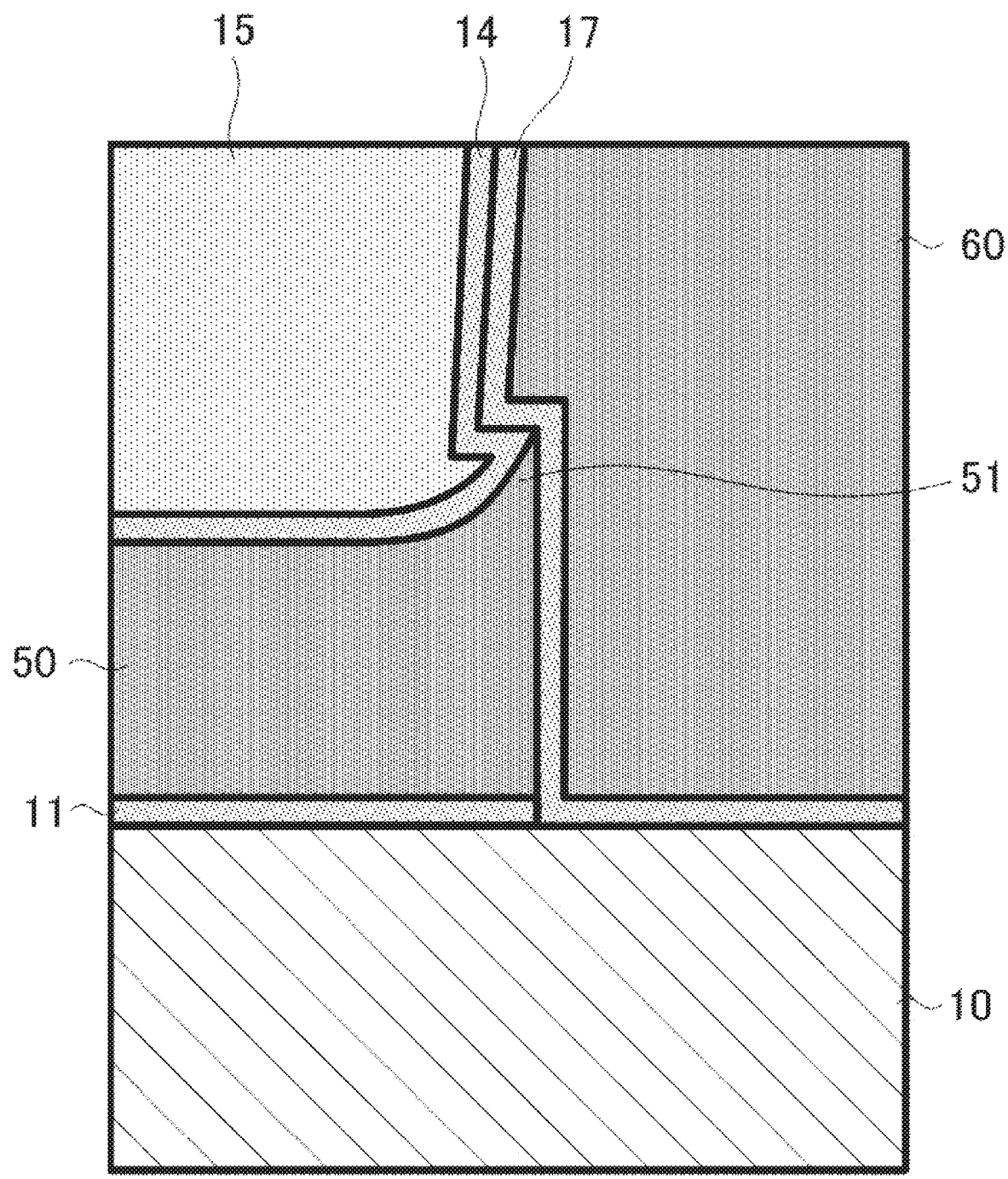
FIG. 2 is an enlarged view of a neighboring region A of a pointed portion according to the exemplary embodiment of the disclosure.

The control gate 60, consisting of a material containing polysilicon, is in contact with the side surface of the floating gate 50 via a tunnel insulation film 17, and is in contact with the side surface of the spacer 15 via the tunnel insulation film 17 and the protective oxidized film 14. Namely, the side surface of the spacer 15 is covered with two insulation films including the protective oxidized film 14 and the tunnel insulation film 17. The control gate 60 is in contact with the surface of the semiconductor substrate 10 via the tunnel insulation film 17. A side surface of the control gate 60 at the side closer to the drain diffusion layer 40 is covered with the side wall 61 consisting of an insulating material such as NSG FIG. 2 is an enlarged view of a neighboring region A of the pointed portion 51 surrounded by a dotted line in FIG. 1. As illustrated in FIG. 2, an end portion of the pointed portion 51 projecting from the side surface of the spacer 15 (an inclined surface of the pointed portion 51) is covered with two layers of insulation films, including the protective oxidized film 14 and the tunnel insulation film 17. In other words, the end portion of the pointed portion 51 is in contact with the control gate 60 via the protective oxidized film 14 and the tunnel insulation film 17.

As illustrated in FIG. 1, the source diffusion layer 30 and the drain diffusion layer 40 are placed separately from each other in the surface of the semiconductor substrate 10 with the floating gate 50 and the control gate 60 interposed in between. The source wiring 31, consisting of, for example, polysilicon, is connected to the source diffusion layer 30. The source wiring 31 is in contact with the side surfaces of the floating gate 50 and the spacer 15 at a side closer to the source diffusion layer 30 via an insulation film 16. The drain diffusion layer 40 includes a low concentration diffusion layer 41a formed of conductive impurities with a relatively low concentration, and a high concentration diffusion layer 41b formed of conductive impurities with a relatively high concentration. The high concentration diffusion layer 41b is provided inside the low concentration diffusion layer 41a. Further, at a surface of each of the source wiring 31, the control gate 60, and the high concentration diffusion layer 41b, a silicide layer 70 is provided.

In the memory cell 100 having the configuration described above, in a case in which, for example, data "0" is written, the semiconductor substrate 10 is set to a voltage of, for example, 0V, and predetermined voltages are applied respectively to the control gate 60 and the source wiring 31. Accordingly, a current flows in a channel area below the control gate 60 and the floating gate 50, and electrons are injected into the floating gate 50 via a gate insulation film 11. The injected electrons are accumulated in the floating gate 50. Injection of the electrons into the floating gate 50 increases a threshold voltage of the memory cell 100. On the other hand, in a case in which the data "0" written in the memory cell 100 is written into the data "1" (for erasing data), the voltages of the drain diffusion layer 40 and the source diffusion layer 30 are set to a voltage of, for example, 0V, and a predetermined voltage is applied to the control gate 60. Accordingly, Fowler-Nordheim Tunneling Current flows through the tunnel insulation film 17, and the electrons accumulated in the floating gate 50 are extracted to the control gate 60. Accordingly, compared with the case in which the electrons are accumulated in the floating gate 50, the threshold voltage of the memory cell 100 is lowered. Since concentration of electric field to the pointed portion 51 occurs due to the floating gate 50 having the pointed portion 51, rewriting of data to data "1" (erasing of data) is enabled with a relatively low voltage. Note that, a state in which electrons are accumulated in the floating gate 50 may be set as data "1" and a state in which electrons are not accumulated in the floating gate may be set as data "0".

Figure 3A:
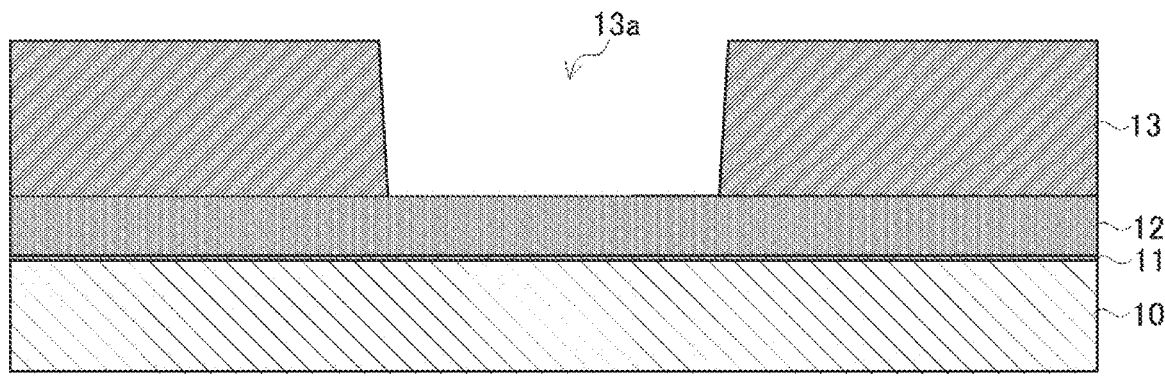
FIG. 3A to FIG. 3Q are cross-sectional views illustrating a semiconductor device manufacturing method according to the exemplary embodiment of the disclosure.
Figure 3B:
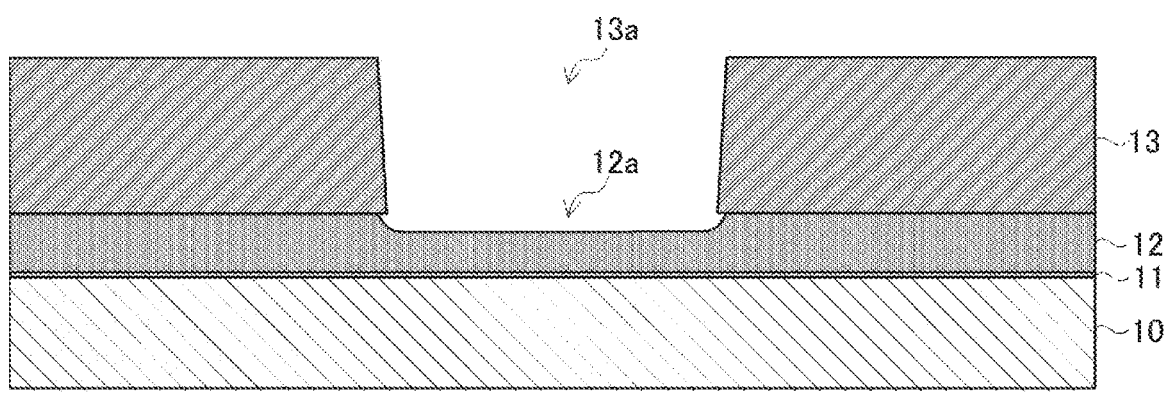
Figure 3C:
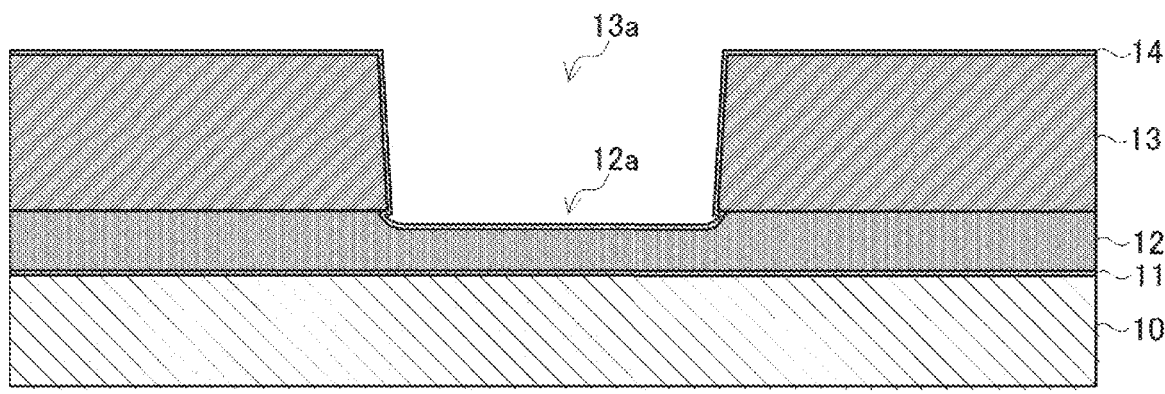
Figure 3D:
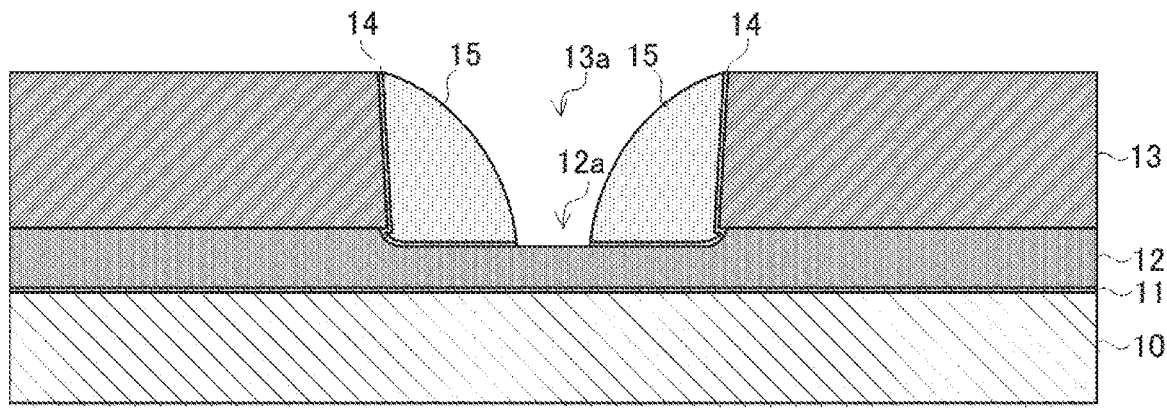
Figure 3E:
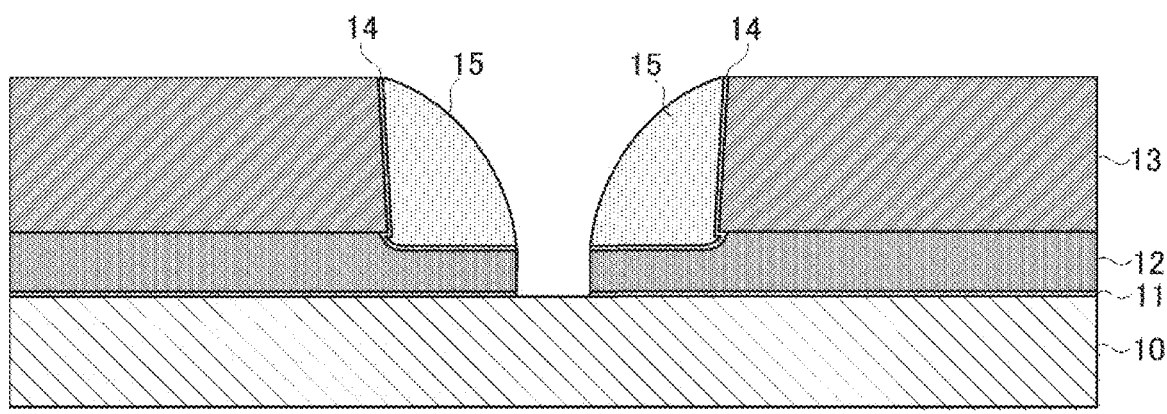
Figure 3F:
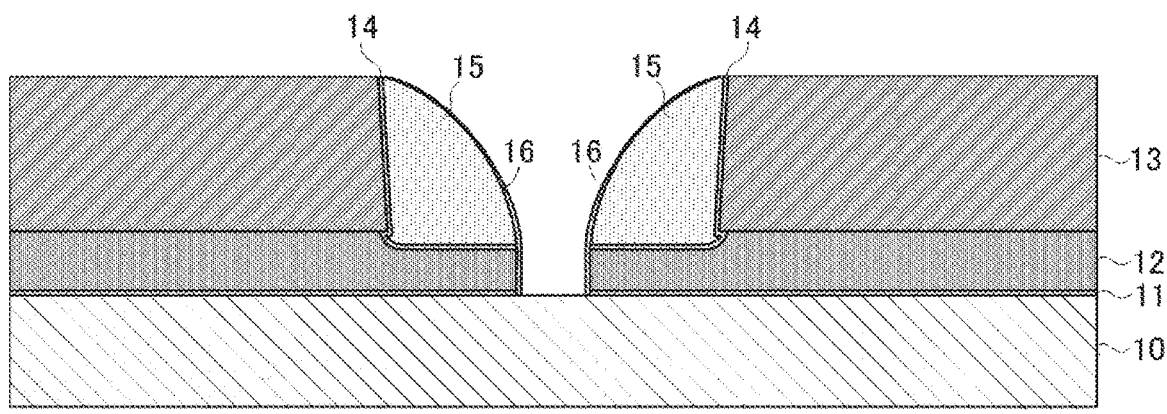
Figure 3G:
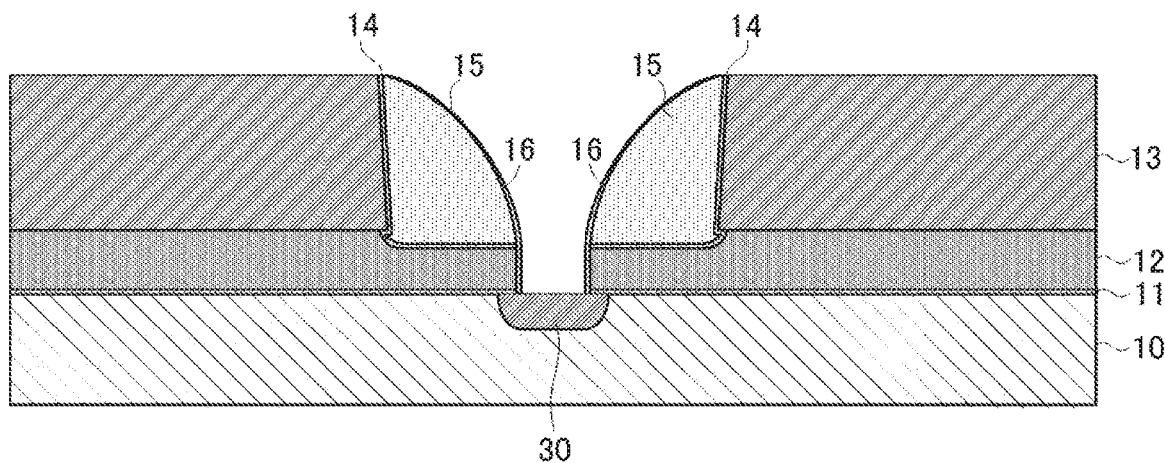
Figure 3H:
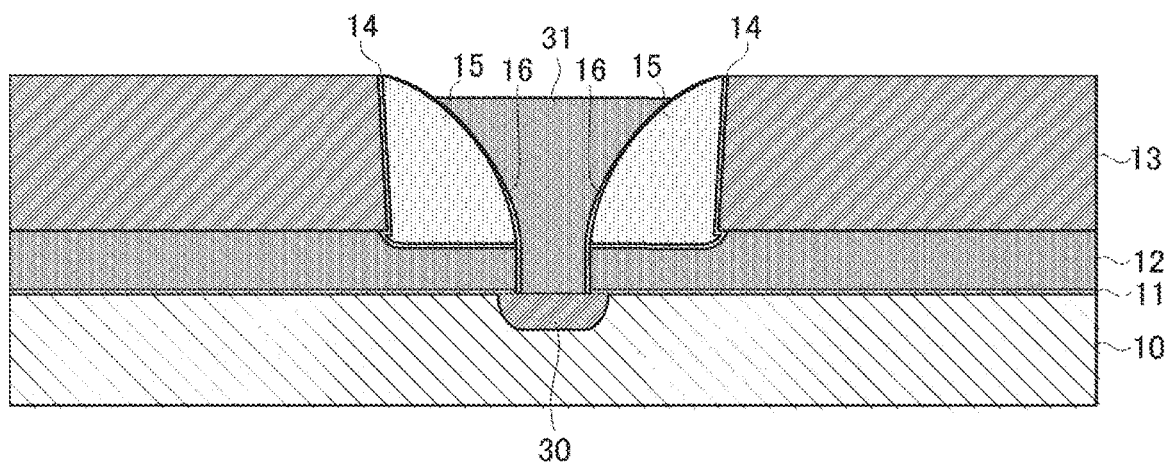
Figure 3I:
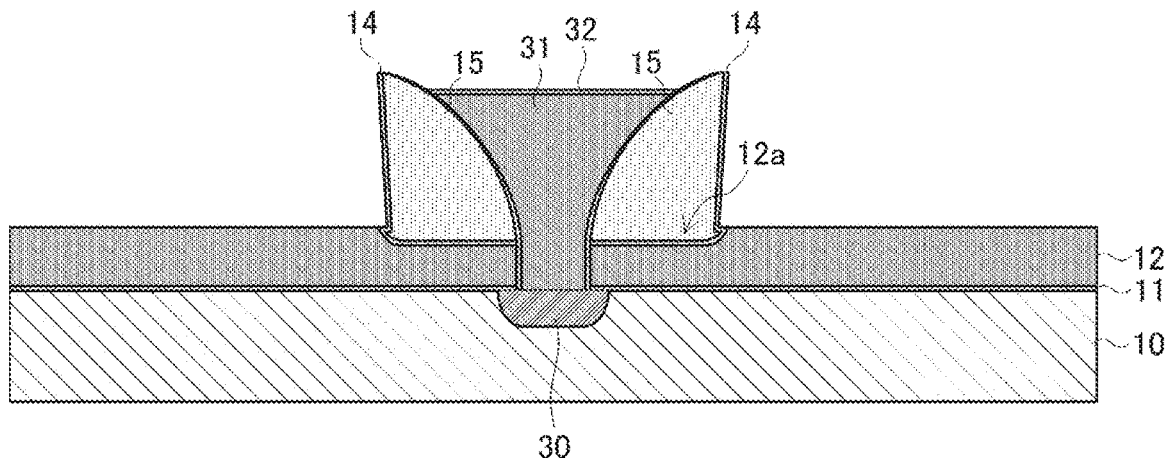
Figure 3J:
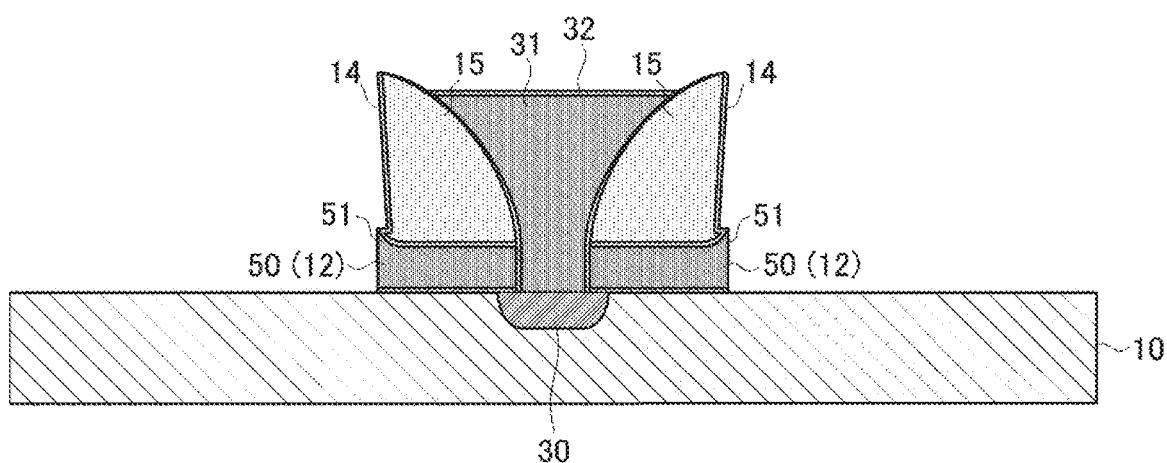
Figure 3K:
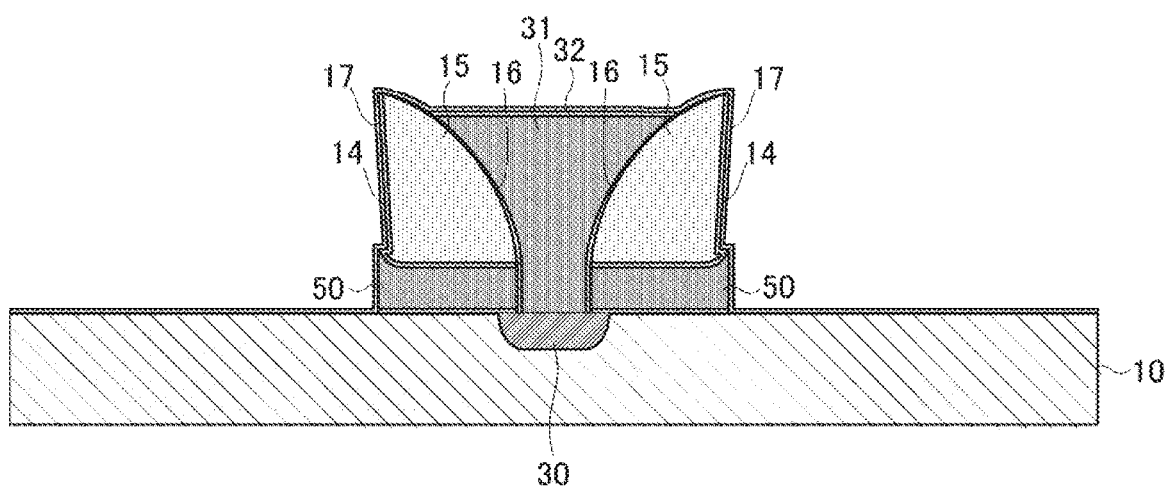
Figure 3L:
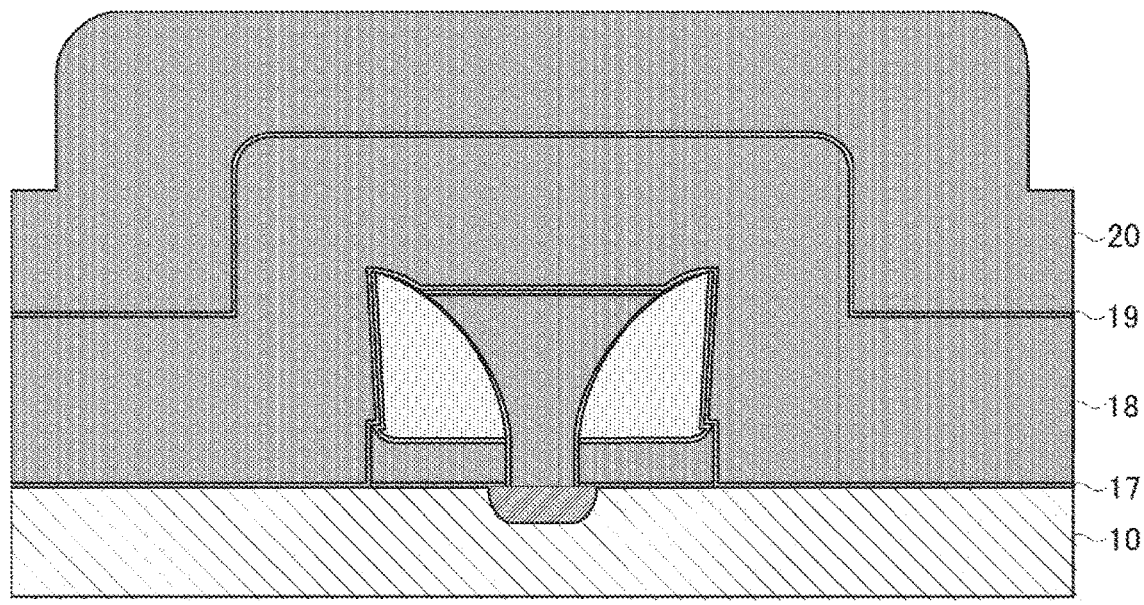
Figure 3M:
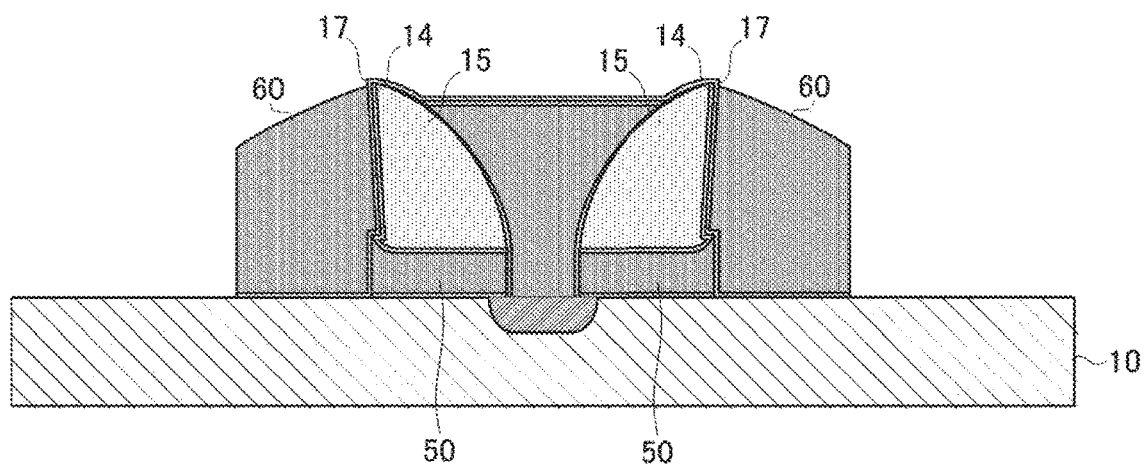
Figure 3N:
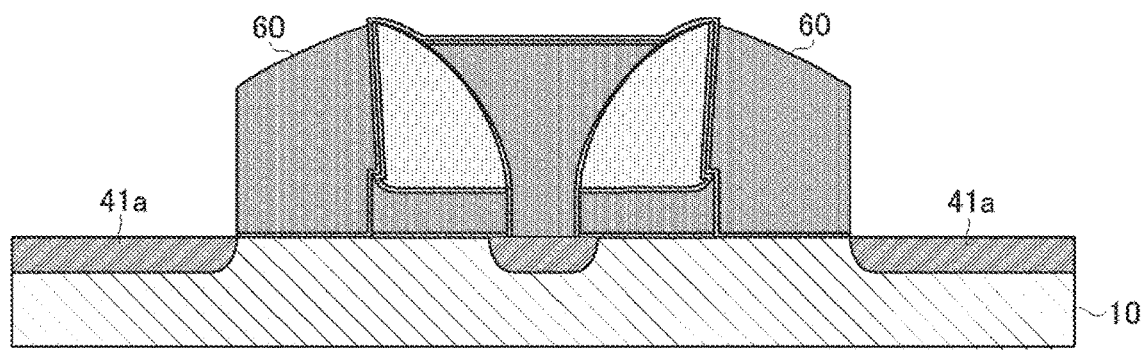
Figure 3O:
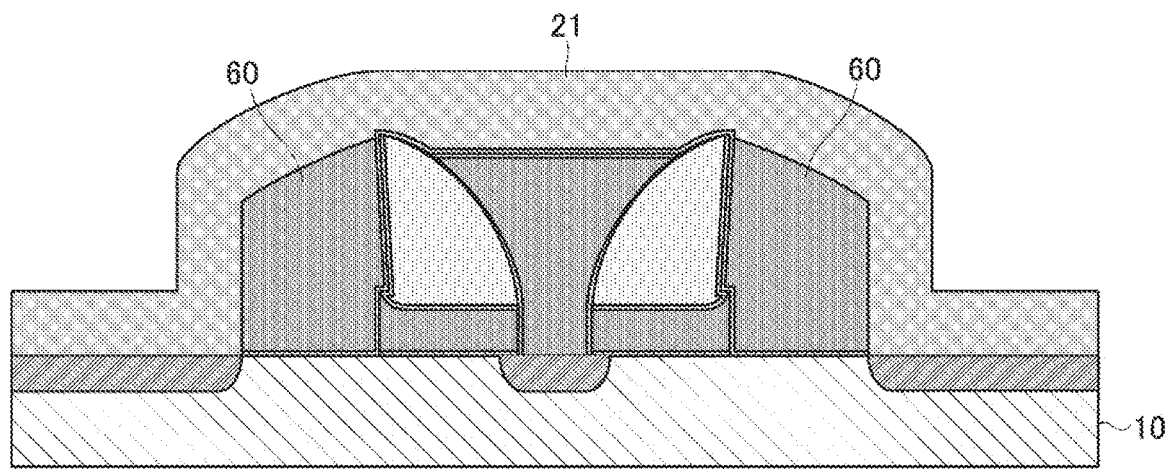
Figure 3P:
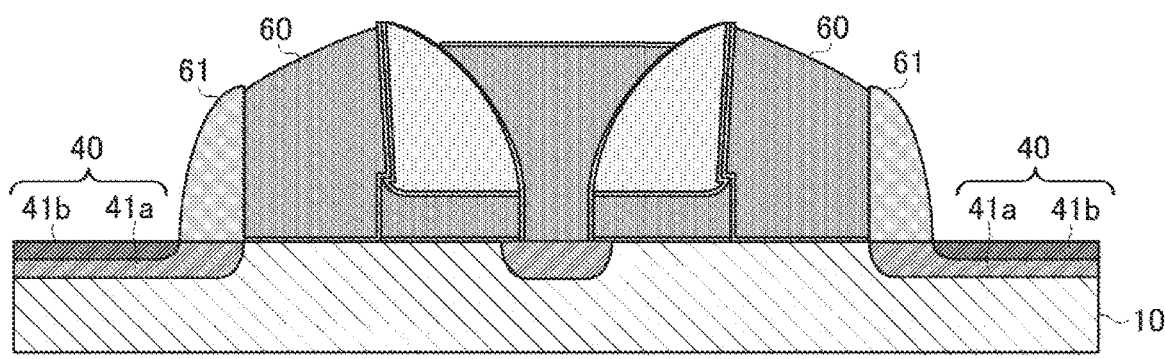
Figure 3Q:
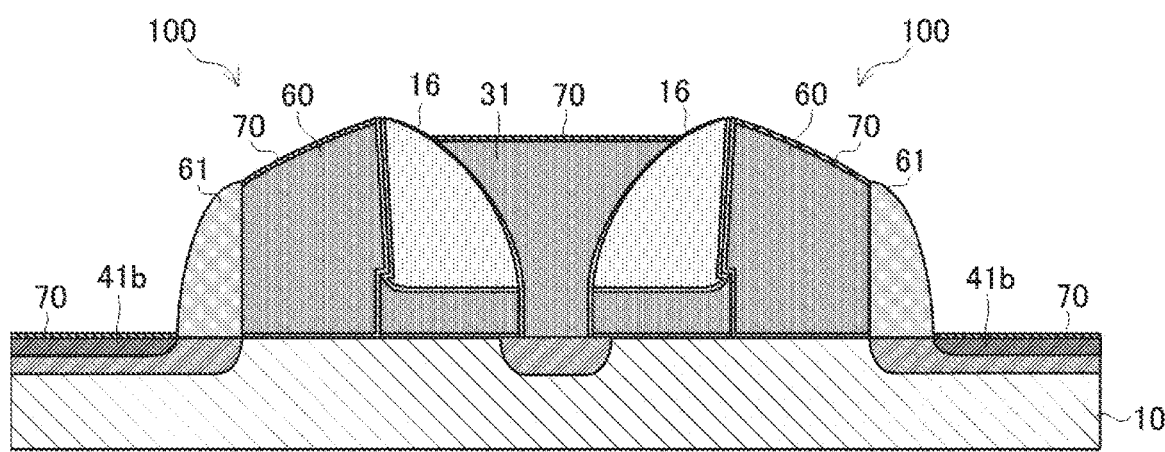

With reference to FIG. 3A to FIG. 3Q, a manufacturing method of the semiconductor device 1 will be described below. In a first step, a gate insulation film 11 consisting of an insulating material such as $SiO_2$ and having a thickness of 8 nm is formed at the surface of the semiconductor substrate 10 consisting of, for example, a p-type silicon by a thermal oxidation method. Next, a polysilicon film 12 having a thickness of approximately 80 nm is formed at the surface of the gate insulation film 11 by, for example, Chemical Vapor Deposition (CVD) method. The polysilicon film 12 configures a floating gate 50 of a memory cell. Next, a nitride film (silicon nitride film $Si_3N_4$ film) 13 having a thickness of approximately 300 nm is formed at a surface of the polysilicon film 12 by, for example, the CVD method. Next, an opening 13a is formed in the nitride film 13 at a position in which the floating gate 50 and the source diffusion layer 30 are formed. The opening 13a is formed by a photolithography technique and an etching technique, and a polysilicon film 12 is exposed at the opening 13a (FIG. 3A).

Next, the surface of the polysilicon film 12 is etched for approximately 20 nm using the nitride film 13 as a mask, and a concave portion 12a is formed at the surface of the polysilicon film 12. Isotropic etching is used for forming the concave portion 12a. Accordingly, an end portion of the concave portion 12a is formed under the nitride film 13. An inclined surface formed at the end portion of the concave portion 12a corresponds to an inclined surface of the pointed portion 51 of the floating gate 50 (FIG. 3B).

Next, a protective oxidized film 14, consisting of an insulating material such as $SiO_2$, having a thickness of approximately 5 nm is formed at a surface of the nitride film 13, a side surface of the opening 13a and a surface of the concave portion 12a in the polysilicon film 12. The protective oxidized film 14 is formed by using, for example, Low Pressure CVD method (LP-CVD method). The protective oxidized film 14 is a High Temperature Oxide film (HTO film) having a desirable film quality (FIG. 3C).

Here, a case in which an oxidized film is formed at the surface of the concave portion 12a of the polysilicon film 12 by thermal oxidation, will be considered. In this case, the oxidized film develops according to grains (crystalline particles) in the polysilicon film 12, and the end of the pointed portion 51 of the floating gate 50, which will be formed later, is formed into a shape having irregularity, due to the grains in the polysilicon film 12. Accordingly, extraction of electrons from the floating gate 50 may become unstable. However, in the manufacturing method the present exemplary embodiment, the protective oxidized film 14 is formed by the CVD. Accordingly, the shape of the end of the pointed portion 51 of the floating gate 50 does not depend on the grains in the polysilicon film 12, and generation of irregularity at the end of the pointed portion 51 may be prevented. Thus, in the present exemplary embodiment, extraction of electrons from the floating gate 50 may be stabilized, and writing/erasing characteristics of the memory cell may be improved.

After the protective oxidized film 14 has been formed, the protective oxidized film 14 is densified (hardened) by Rapid Thermal Anneal (RTA) treatment. Densifying the protective oxidized film 14 improves etching resistance of the protective oxidized film 14 against etchant used for etching of the nitride film 13. Densification of a CVD oxidized film by RTA treatment develops from a surface of the CVD oxidized film. In the present exemplary embodiment, since the protective oxidized film 14 is formed with a thickness of 5 nm, the protective oxidized film 14 may be densified entirely in the thickness direction. Thus the etching resistance in entire protective oxidized film 14 may be achieved. In the present exemplary embodiment, this RTA treatment is applied under argon atmosphere, in order to prevent oxidation of the polysilicon film 12, maintain the shape of the end of the pointed portion 51, and improve selectivity with respect to the nitride film 13.

Next, a conformal NSG film (SiO2) is formed at the upper surface of the nitride film 13, at the side surface of the opening 13a, and at a surface of the protective oxidized film 14 formed on the surface of the concave portion 12a of the polysilicon film 12, by, for example, the CVD method. Next, the spacer 15 is formed by performing etch-back treatment on the NSG film by isotropic dry etching. The spacer 15 is formed in contact with the side surface of the opening 13a of the nitride film 13 and the upper surface of the polysilicon film 12 via the protective oxidized film 14, and exposes the polysilicon film 12 at a center of the concave portion 12a of the polysilicon film 12 (FIG. 3D).

Next, the polysilicon film 12 and the gate insulation film 11 are etched by dry etching using the spacer 15 as a mask, and the semiconductor substrate 10 is exposed. In other words, patterning of the polysilicon film 12 is achieved by the etching process (FIG. 3E).

Next, an insulation film 16 is formed by forming the NSG that covers exposed portions of the nitride film 13, the spacer 15, the polysilicon film 12, the gate insulation film 11, and the semiconductor substrate 10, for example, by the CVD method, and etching the NSG back by anisotropic etching. The insulation film 16 covers side surfaces of the spacer 15, the polysilicon film 12, and the gate insulation film 11 while exposing the semiconductor substrate 10 (FIG. 3F).

Next, n-type source diffusion layer 30 is formed on the surface of the semiconductor substrate 10 exposed in the openings of the spacer 15 and the insulation film 16 for example, by an ion implantation method. In the ion implantation process, the spacer 15 and the insulation film 16 are used as masks, and a quinquevalent element such as phosphorous is implanted into the semiconductor substrate 10 (FIG. 3G).

Next, a polysilicon film is formed to fill the opening formed in the spacer 15 and the insulation film 16 by, for example, the CVD method. Next, etch-back treatment is applied to the polysilicon film, whereby the source wiring 31 is formed. The etch-back treatment is performed such that the heightwise position of the source wiring 31 becomes lower than the heightwise position of the top portion of the upper surface of the nitride film 13 and the spacer 15. The source wiring 31 is electrically connected to the source diffusion layer 30 and is insulated from the polysilicon film 12 by the insulation film 16 (FIG. 3H).

Next, a protection film 32 consisting of an insulating material such as $SiO_2$ and having a thickness on the order of approximately 10 nm is formed on a surface of the source wiring 31 by, for example, a heat oxidation method. Next, the nitride film 13 is removed by etching using phosphoric acid ($H_3PO_4$) at a temperature of, for example, 150° C. Accordingly, a portion of the protective oxidized film 14 covering the side surface of the spacer 15 and the surface of the polysilicon film 12 are exposed (FIG. 3I).

In the etching step, the surface of the source wiring 31 is protected by the protection film 32 consisting of a thermally oxidized film. Further, the side surface of the spacer 15 and the end portion of the concave portion 12a of the polysilicon film 12 (inclined surface of the pointed portion 51) are protected by the protective oxidized film 14. In particular, since the protective oxidized film 14 is configured by the CVD oxidized film densified by RTA treatment, the etching rate with respect to the phosphoric acid is low, and thus etching in the lateral direction and the vertical direction is hardly occurred. Accordingly, etching of the side surface of the spacer 15 may be prevented, and thus the shape of the spacer 15 may be maintained. Thus, formation of a concavity space (see the concavity space 200 in FIG. 4B) at the vicinity of the inclined surface (pointed portion 51) of the polysilicon film 12 when etching the spacer 15 may be prevented.

Here, for example, in a case in which RTA treatment is performed at a CVD oxidized film having a film thickness of 100 nm or larger, only the surface of the CVD oxidized film becomes densified, and an interior of the CVD oxidized film may not densified. Therefore, even in a case in which the surface of the spacer 15 is densified by heat treatment, instead of using the protective oxidized film 14, the effect for preventing the etching at the side surface of the spacer 15 may not be achieved, compared to a case in which the protective oxidized film 14 is used Next, the polysilicon film 12 is patterned by dry etching, using the spacer 15 and the protective oxidized film 14 as a mask. Accordingly, a pair of the floating gates 50, separated from each other with the source wiring 31 interposed in between, are formed. Next, the gate insulation film 11 on the semiconductor substrate 10 is removed (FIG. 3J). The pointed portion 51 is formed at the end portion of the floating gate 50 by the concave portion 12a in the polysilicon film 12 formed in the previous step. The end of the pointed portion 51 is formed having an edge that does not depend on the grains (crystalline particles) in the polysilicon film 12 in a depth direction (the viewing direction of FIG. 3J).

Next, the tunnel insulation film 17 is formed to cover the surface of the semiconductor substrate 10, the side surface of the floating gate 50, the surface of the protective oxidized film 14, and the exposed portions of the insulation film 16 and the protection film 32. The tunnel insulation film 17 is formed of an insulating material such as $SiO_2$, has a thickness of approximately 10 nm, and is formed by, for example, the CVD method (FIG. 3K). The end portion of the pointed portion 51 of the floating gate 50 projecting from the side surface of the spacer 15 (an inclined surface of the pointed portion 51) is covered with two layers of insulation films, namely, the protective oxidized film 14 and the tunnel insulation film 17. Accordingly, in the present exemplary embodiment, extraction of electrons from the floating gate 50 to the control gate 60 may be prevented.

Next, a polysilicon film 18 having a thickness of approximately 200 nm is formed to cover a surface of the tunnel insulation film 17 by, for example, the CVD method (FIG. 3L). The polysilicon film 18 is insulated from the floating gate 50 and the semiconductor substrate 10 by the tunnel insulation film 17. The polysilicon film 18 configures the control gate 60. Next, an insulation film 19 formed of an insulating material such as $SiO_2$ having a thickness of approximately 8 nm is formed to cover the polysilicon film 18 by, for example, the CVD method. Next, a polysilicon film 20 having a thickness of approximately 100 nm is formed to cover the insulation film 19 by, for example, the CVD method (FIG. 3L). The insulation film 19 configures a gate insulation film of a transistor (not illustrated) that configures a peripheral circuit formed together with the memory cell 100 on the semiconductor substrate 10. The polysilicon film 20 configures a gate of the transistor that configures the peripheral circuit.

Next, patterning of the polysilicon film 20 is performed by photograph technique and etching technique to form a gate electrode of the peripheral circuit. At this time, in an area in which the memory cells 100 is formed, the polysilicon film 20 formed at the polysilicon film 18 is removed. Next, the polysilicon film 18 is patterned by etch back treatment that removes the insulation film 19 and retracts the polysilicon film 18 by anisotropic dry etching. Accordingly, the control gate 60 is formed (FIG. 3M). The control gate 60 is in contact to the floating gate 50 via the tunnel insulation film 17 and is contact to the spacer 15 via the tunnel insulation film 17 and the protective oxidized film 14.

Next, for example, the n-type low concentration diffusion layer 41a is formed at the surface of the semiconductor substrate 10 by, for example, an ion implantation method. In the ion implantation process, the control gate 60 is used as a mask, and a quinquevalent element such as phosphorous is implanted into the semiconductor substrate 10. The amount of ion implantation is, for example, $1\times10^{13}/cm^2$ (FIG. 3N).

Next, an insulation film 21 is formed to cover the entire portion of the memory cell 100 by, for example, the CVD method is formed (FIG. 3O). The insulation film 21 configures the side wall 61 of the control gate 60. The insulation film 21 may be formed of, for example, a layered film formed by layering a NSG film having a thickness on the order of 10 nm and a SiN film having a thickness on the order of 90 nm. The insulation film 21 may be a single layer film formed of a single material.

Next, the side wall 61 is formed by etch back treatment that retracting the insulation film 21 by, for example, anisotropic dry etching. The side wall 61 is in contact with the side surface of the control gate 60 and covers an end portion of the low concentration diffusion layer 41a. Next, for example, the n-type high concentration diffusion layer 41b is formed in the low concentration diffusion layer 41a by, for example, an ion implantation method. In the ion implantation process, the control gate 60 and the side wall 61 are used as masks, and a quinquevalent element such as phosphorous is implanted into the surface of the low concentration diffusion layer 41a. The amount of ion implantation is, for example, $1\times10^{15}/cm^2$ (FIG. 3P). The low concentration diffusion layer 41a and the high concentration diffusion layer 41b configure the drain diffusion layer 40.

Next, after the protection film 32 that covers an upper surface of the source wiring 31 has been removed, a cobalt film having a thickness of approximately 10 nm is formed to cover the entire portion of the memory cell 100 by, for example, a spatter method. Next, RTA treatment of approximately 550° C. is applied. Cobalt and silicon react by the heat treatment, and silicide layers 70 are formed at the respective surfaces of the control gate 60, the source wiring 31, and the high concentration diffusion layer 41b. Next, unreacted cobalt deposited at the insulation film 16 and the side wall 61 is removed by washing using sulfuric acid peroxide mixture or ammonia hydrogen peroxide mixture (FIG. 3Q). Note that the silicide layer formed in self-aligned manner is referred to as "salicide". By forming a silicide layer 70, reduction of resistance of the control gate 60, the source wiring 31, and the high concentration diffusion layer 41b is enabled. Note that molybdenum, tungsten, titanium, nickel may also be used instead of cobalt.

By covering the surface of the semiconductor substrate 10 with the NSG film and forming a wire to be connected to the control gate 60, the source wiring 31, and the drain diffusion layer 40 after the above-described steps, formation of memory cells 100 for a split-gate nonvolatile memory is achieved.

Figure 4A:
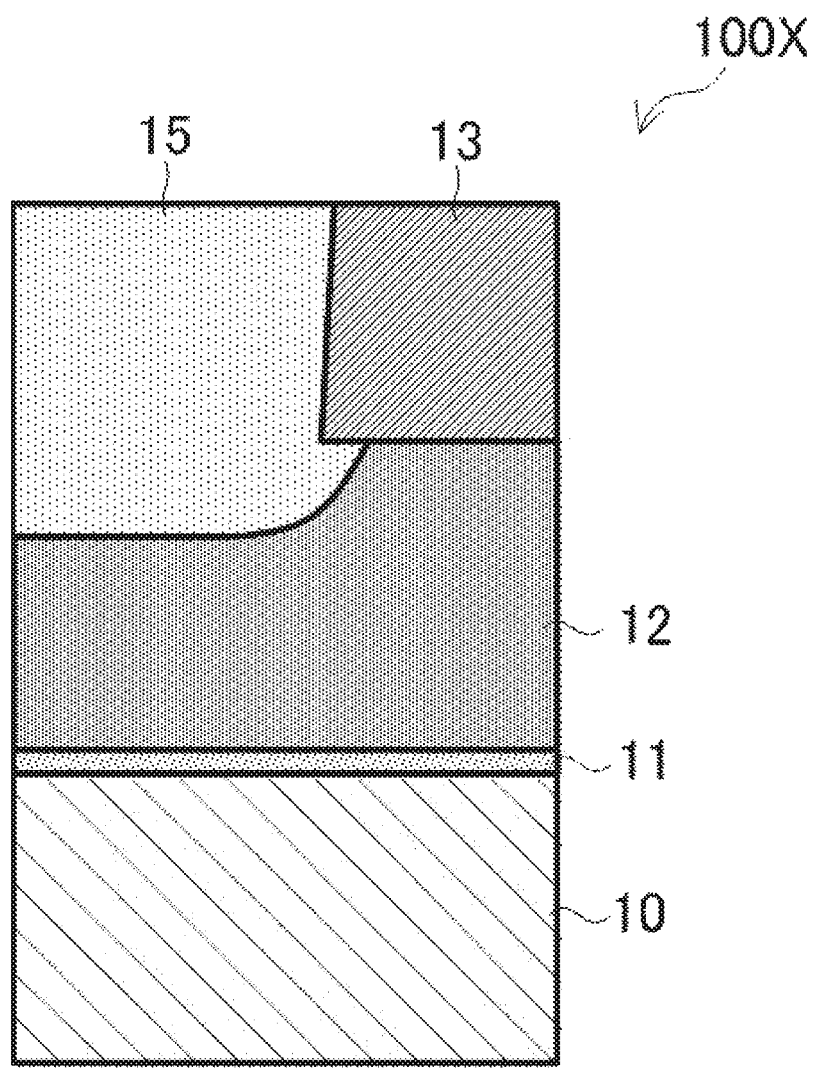
FIG. 4A to FIG. 4D are partial cross-sectional views illustrating a memory cell manufacturing steps according to a comparative example.
Figure 4B:
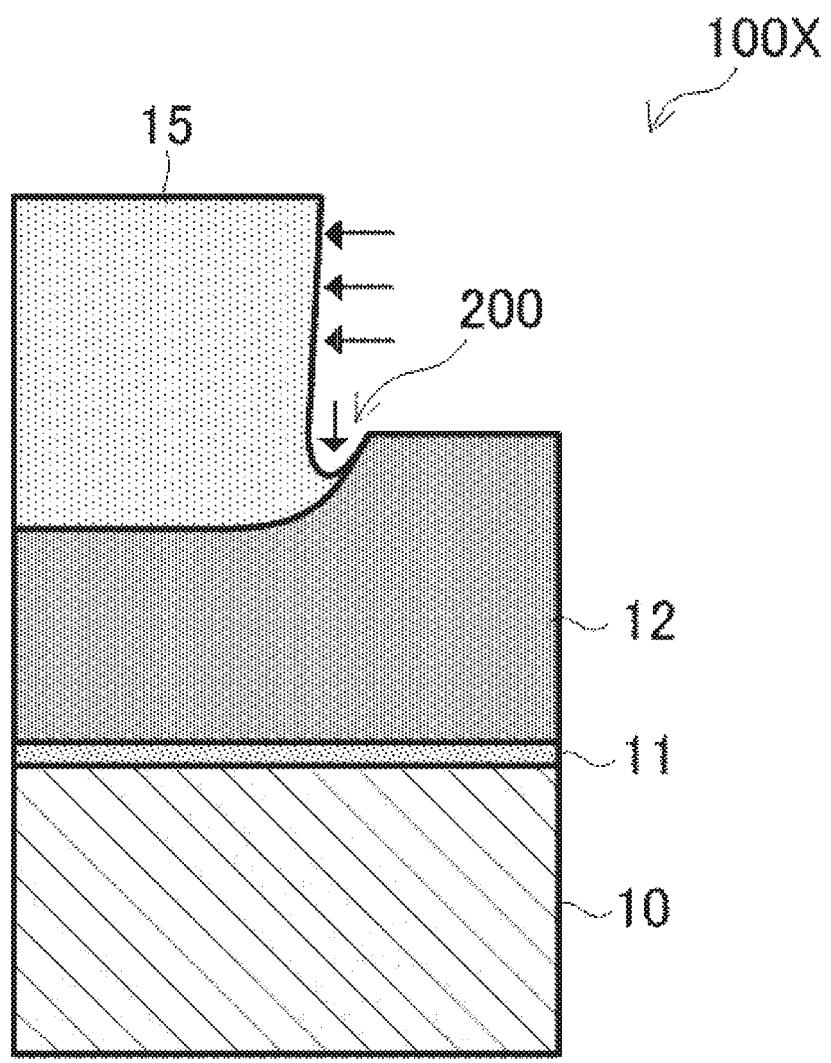

FIG. 4A to FIG. 4D are partial cross-sectional views each illustrating a memory cell 100X manufacturing step according to a comparative example. The memory cell 100X according to a comparative example does not have a protective oxidized film 14 that the memory cell 100 according to the exemplary embodiment has. In other words, as illustrated in FIG. 4A, the spacer 15 directly contacted with the polysilicon film 12 and the nitride film 13 that constitute the floating gate. Therefore, as illustrated in FIG. 4B, the side surface of the spacer 15 is etched and retracted by etching for removing the nitride film 13. Retraction of the spacer 15 by etching occurs not only in the lateral direction, but also in the vertical direction. Thus, the concavity space 200 is created in the vicinity of the inclined surface of the polysilicon film 12 that forms the pointed portion 51 of the floating gate 50.

Figure 4C:
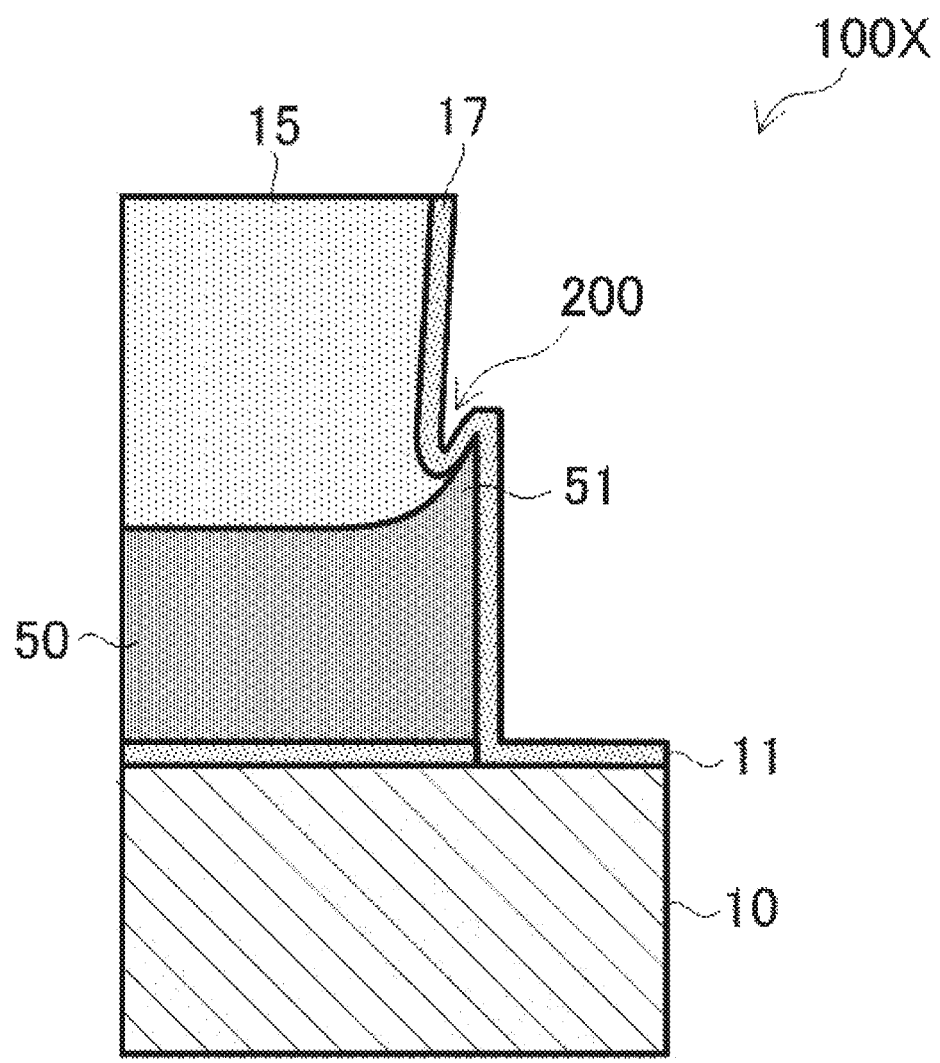
Figure 4D:
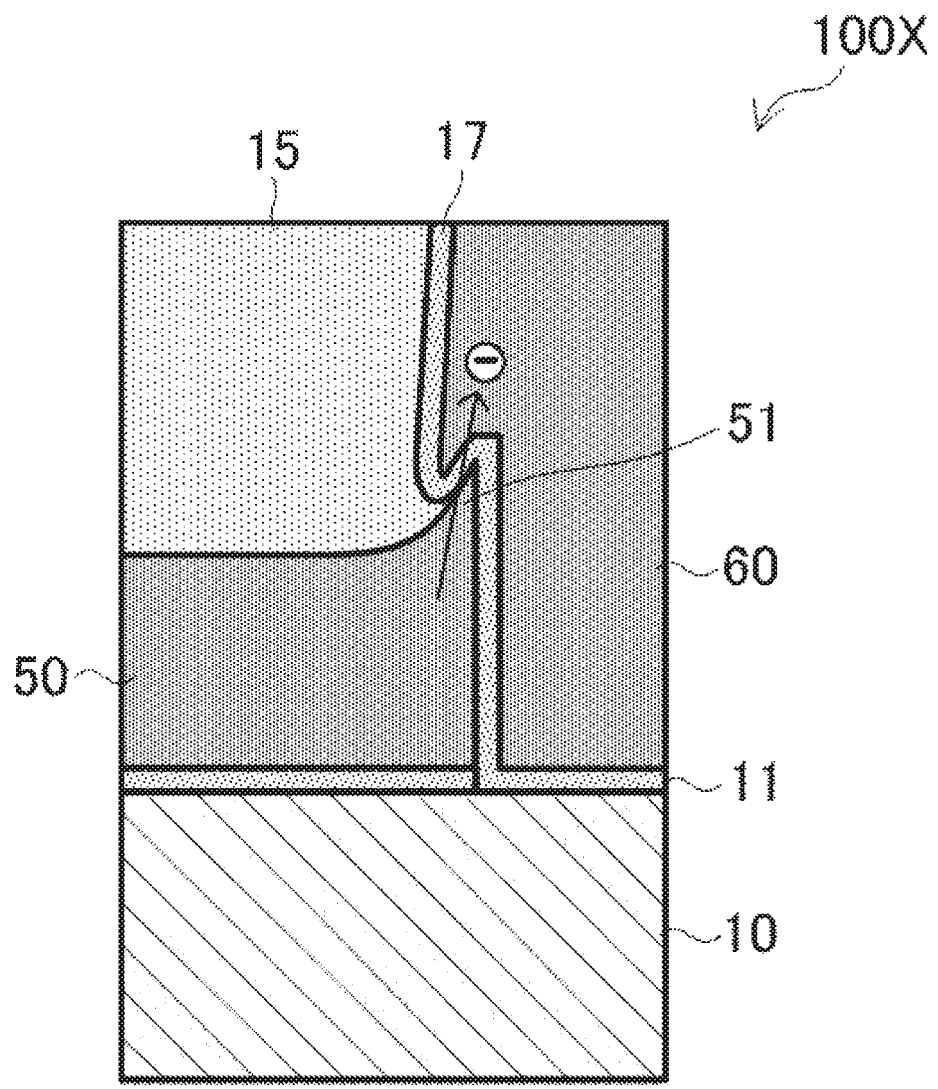

Since the concavity space 200 is small, filling of the tunnel insulation film 17 in the concavity space 200 becomes insufficient as illustrated in FIG. 4C. Accordingly, at a position where the concavity space 200 is formed, the tunnel insulation film 17 may be reduced in film thickness or the film quality may be deteriorated. Accordingly, as illustrated in FIG. 4D, electrons accumulated in the floating gate 50 are extracted to the control gate 60, and data stored in the memory cell 100X may be rewritten. For example, in a case in which the spacer 15 is densified by heat treatment for preventing etching of the spacer 15, a portion that is densified by heat treatment is limited to the surface of the spacer 15. In other words, densifying the spacer 15 to the bottom portion where the pointed portion 51 is present is difficult. Therefore, in the memory cell 100X of the comparative example, preventing the formation of the concavity space 200 is difficult, in a case in which the side surface of the spacer 15 is not covered with the protective oxidized film 14.

In contrast, according to the semiconductor device 1 and the manufacturing method of the exemplary embodiment, the side surface of the spacer 15 is covered with the protective oxidized film 14 that is entirely densified by heat treatment. Accordingly, in the etching for removing the nitride film 13, retraction at the side surface of the spacer 15 may be prevented. Thus creation of a concavity space at the vicinity of the pointed portion 51 of the floating gate 50 may be prevented. In addition, the protective oxidized film 14 that is entirely densified has high etchant resistance against removing the nitride film 13. Thus the film thickness at the time of film formation is maintained even etching of the nitride film 13 is performed. Therefore, when etching of the nitride film 13 is performed, reduction in thickness or deterioration of film quality of the insulation film for covering the pointed portion 51 of the floating gate 50 may be prevented. Accordingly, in the exemplary embodiment, extraction of electrons accumulated in the floating gate 50 to the control gate 60 may be prevented, and data stored in the memory cell 100 being rewritten may be prevented.

Second Exemplary Embodiment

Figure 5:
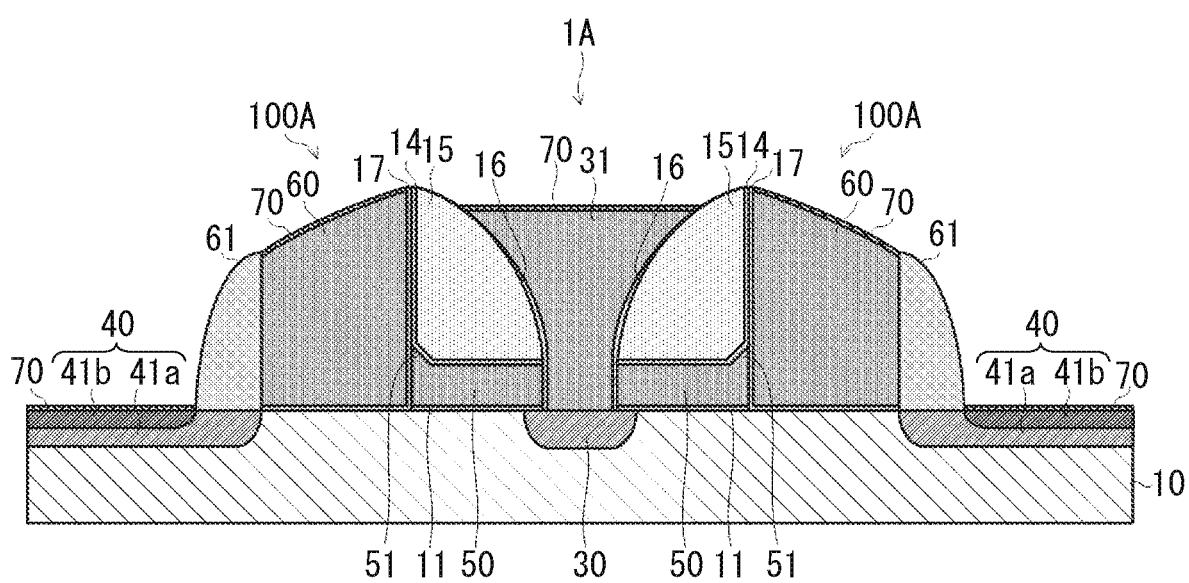
FIG. 5 is a cross-sectional view illustrating a configuration of a semiconductor device according to another exemplary embodiment of the disclosure.

FIG. 5 is a cross-sectional view illustrating a configuration of a semiconductor device 1A according to a second exemplary embodiment of the disclosure. Each memory cell 100A that configures the semiconductor device 1A is different from the semiconductor device 1 according to the first exemplary embodiment, in that the side surface of the spacer 15 is substantially vertical to a main surface of the semiconductor substrate 10, and the surface of the protective oxidized film 14 that covers the side surface of the spacer 15 and the side surface of the floating gate 50 extend in an identical plane.

Figure 6A:
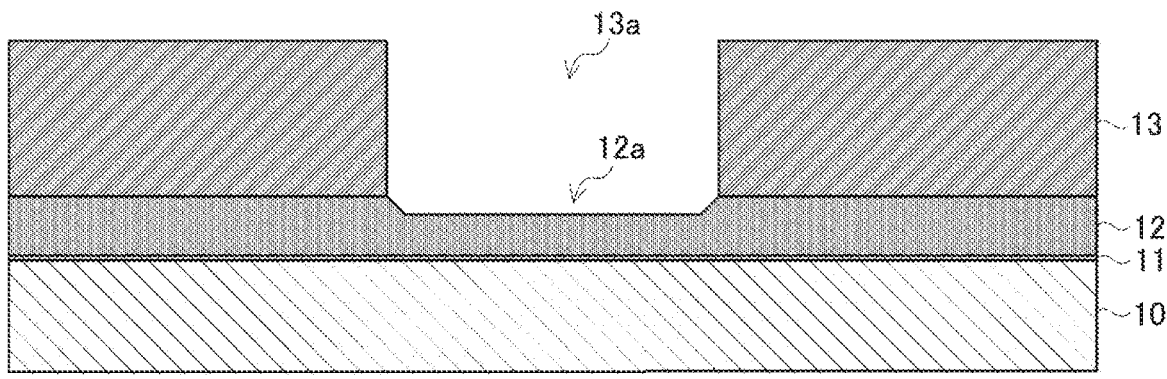
FIG. 6A to FIG. 6H are cross-sectional views illustrating a semiconductor device manufacturing method according to the another exemplary embodiment of the disclosure.

Referring to FIG. 6A to FIG. 6H, a manufacturing method of the semiconductor device 1A will be described below. The polysilicon film 12 that configures the floating gate 50 is formed at the surface of the semiconductor substrate 10 via the gate insulation film 11. Next, the nitride film 13 having the opening 13a is formed at the surface of the polysilicon film 12. The side surface of the opening 13a is formed vertically to the main surface of the semiconductor substrate 10. Next, the surface of the polysilicon film 12 is etched for approximately 20 nm using the nitride film 13 as a mask, and a concave portion 12a is formed at the surface of the polysilicon film 12. Anisotropic etching having high spatter component is used as the etching for forming the concave portion 12a. Accordingly, an inclined surface is formed at an outer edge of the concave portion 12a. The concave portion 12a is formed in an area of the nitride film 13 corresponding to the opening 13a, and an inclined surface formed on an outer edge of the concave portion corresponds to the inclined surface of the pointed portion 51 of the floating gate 50 (FIG. 6A).

Figure 6B:
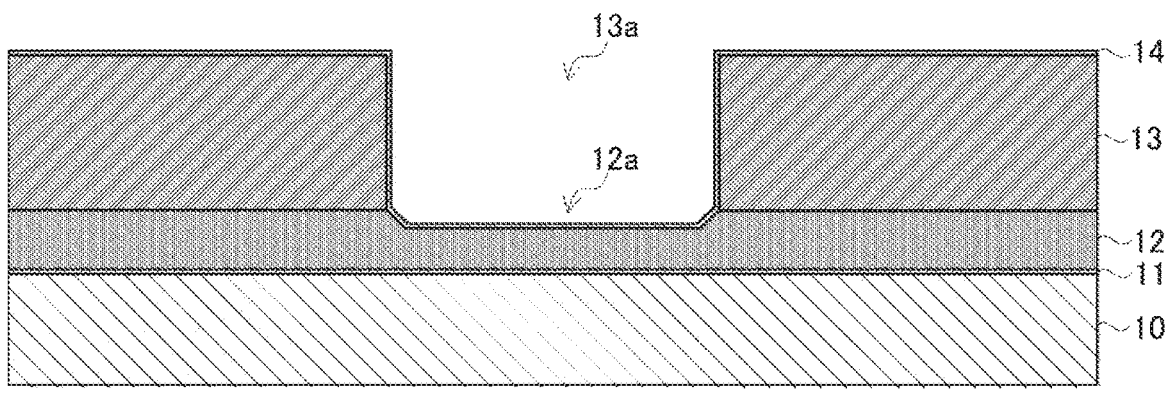

Next, a protective oxidized film 14 is formed at a surface of the nitride film 13, a side surface of the opening 13a and a surface of the concave portion 12a in the polysilicon film 12. The protective oxidized film 14 is formed of an insulating material such as $SiO_2$, has a thickness of approximately 5 nm, and is formed by using, for example, Low Pressure CVD method (FIG. 6B). Next, the protective oxidized film 14 is densified (hardened) by RTA treatment.

Figure 6C:
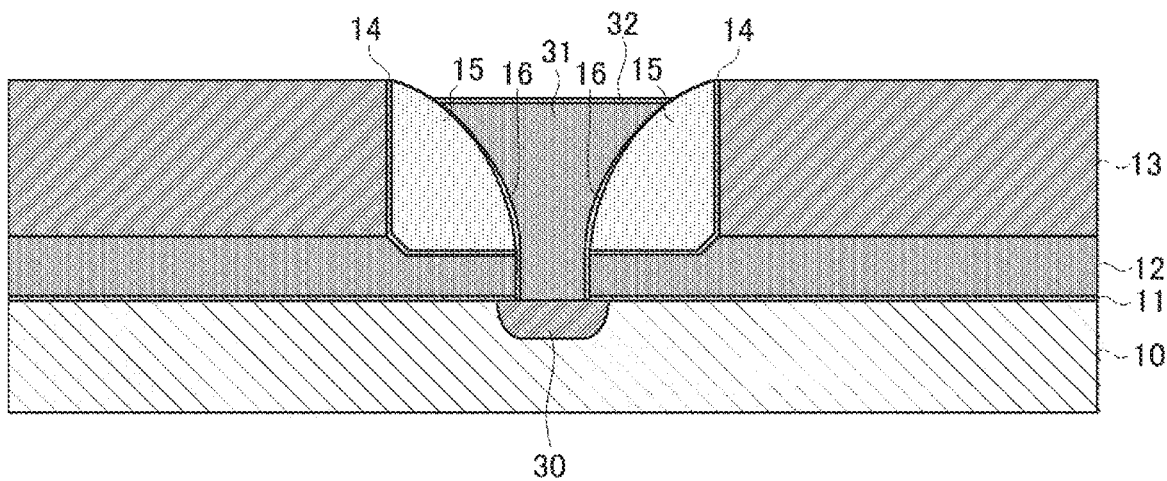

Next, formation of the spacer 15, etching of the polysilicon film 12, formation of the insulation film 16, formation of the source diffusion layer 30, formation of the source wiring 31, and formation of the protection film 32 are performed (FIG. 6C).

Figure 6D:
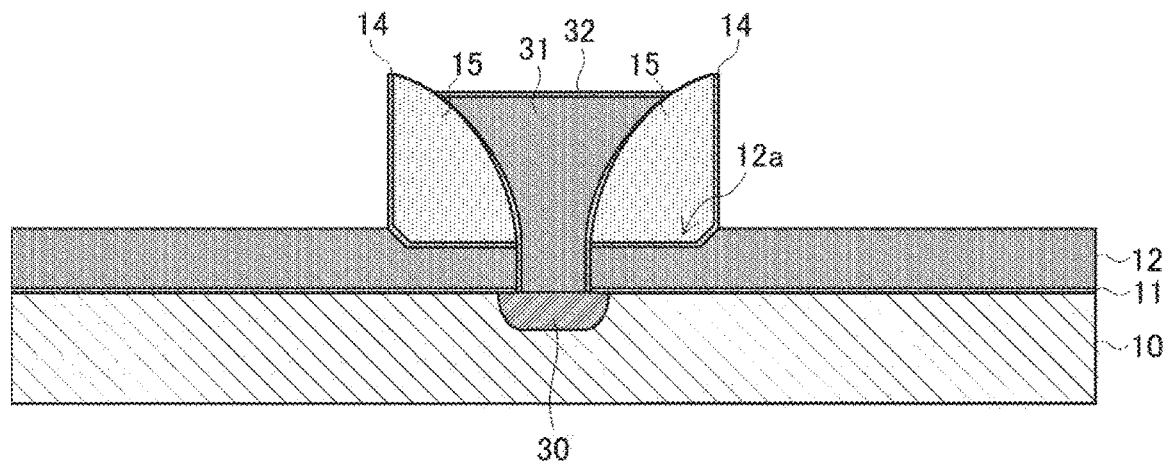

Next, the nitride film 13 is removed by etching using phosphoric acid ($H_3PO_4$) at a temperature of, for example, 150° C. Accordingly, a portion of the protective oxidized film 14 covering the side surface of the spacer 15 and the surface of the polysilicon film 12 are exposed (FIG. 6D). In the etching step, the surface of the source wiring 31 is protected by the protection film 32 formed of a thermally oxidized film. The side surface of the spacer 15 and the end portion of the concave portion 12a of the polysilicon film 12 (inclined surface of the pointed portion 51) are protected by the protective oxidized film 14. In particular, since the protective oxidized film 14 is formed of the CVD oxidized film densified by RTA treatment, the etching rate with respect to the phosphoric acid is low, and thus etching in the lateral direction and the vertical direction is hardly effected. Therefore, etching at the side surface of the spacer 15 is prevented, and thus the shape of the spacer 15 is maintained. Accordingly, formation of a concavity space (see the concavity space 200 in FIG. 4B) at the vicinity of an inclined surface (pointed portion 51) of the polysilicon film 12 in due to etching of the spacer 15 may be prevented.

Figure 6E:
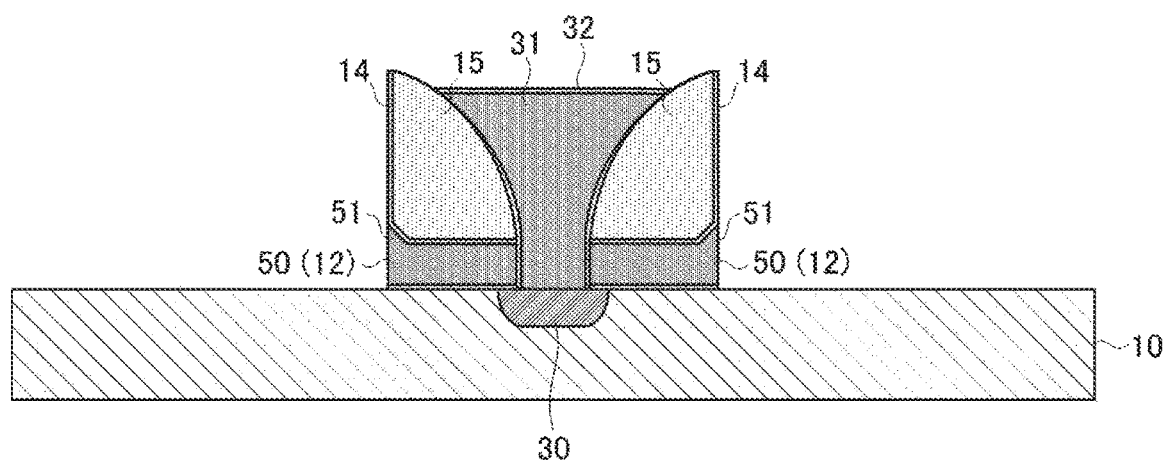

Next, patterning of the polysilicon film 12 is performed by dry etching using the spacer 15 and the protective oxidized film 14 as a mask. Accordingly, a pair of the floating gates 50 separated from each other with the source wiring 31 interposed in between are formed. Next, the gate insulation film 11 on the semiconductor substrate 10 is removed (FIG. 6E). The pointed portion 51 is formed at the end portion of the floating gate 50 by formation of a concave portion 12a in the polysilicon film 12 in the previous step.

In a case in which the polysilicon film 12 is etched by using the spacer 15 having a side surface vertical to the main surface of the semiconductor substrate 10 and the protective oxidized film 14 that covers the side surface of the spacer 15 as masks, an end surface (side surface) of the floating gate 50 exposed by etching has a shape in conformity with the surface shape of the protective oxidized film 14. Therefore, since irregularity is not formed at the end of the pointed portion 51, extraction of electrons from the floating gate 50 may be stabilized, and writing/erasing characteristics of the memory cell 100A may be stabilized.

Figure 6F:
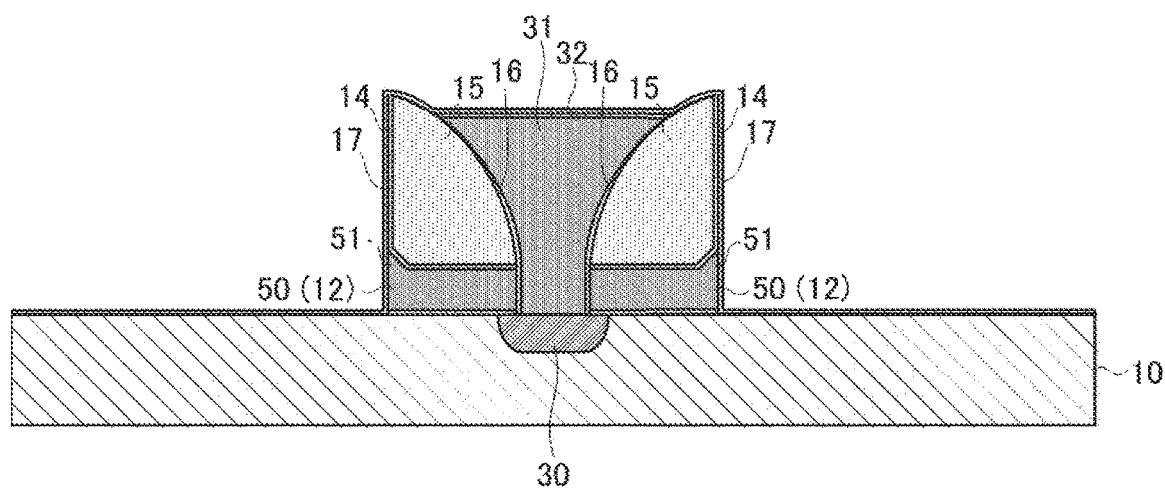

Next, the tunnel insulation film 17 is formed to cover the surface of the semiconductor substrate 10, the side surface of the floating gate 50, the surface of the protective oxidized film 14, and the exposed portions of the insulation film 16 and the protection film 32. The tunnel insulation film 17 is formed of an insulating material such as $SiO_2$, has a thickness of approximately 10 nm, and is formed by, for example, the CVD method (FIG. 6F).

Figure 6G:
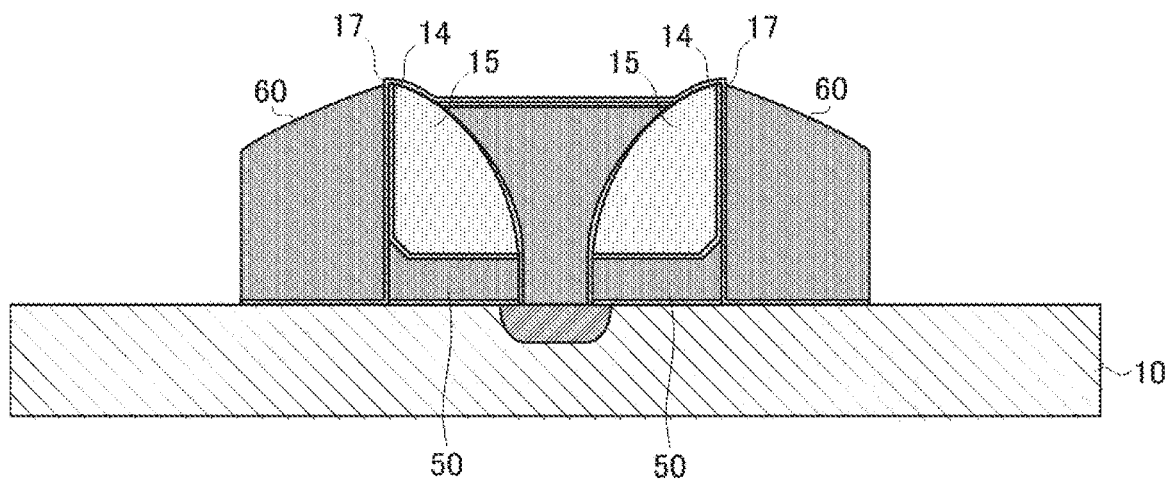

Next, the control gate 60 is formed by forming and patterning of the polysilicon film which configures the control gate 60 by, for example, the CVD method (FIG. 6G). The control gate 60 is in contact with the floating gate 50 via the tunnel insulation film 17 and is contact with the spacer 15 via the tunnel insulation film 17 and the protective oxidized film 14.

Figure 6H:
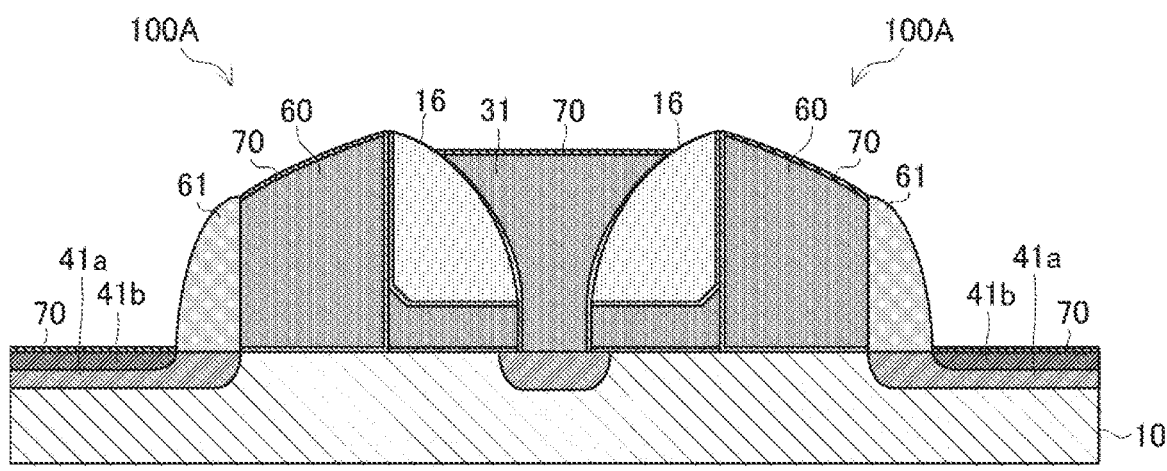

Next, formation of the low concentration diffusion layer 41a, formation of the side wall 61, formation of the high concentration diffusion layer 41b, and formation of the silicide layer 70 are performed (FIG. 6H).

After the above-described steps, by covering the surface of the semiconductor substrate 10 with the NSG film and forming a wire to be connected to the control gate 60, the source wiring 31, and the drain diffusion layer 40, formation of memory cells 100A for a split-gate nonvolatile memory is achieved.

Figure 7A:
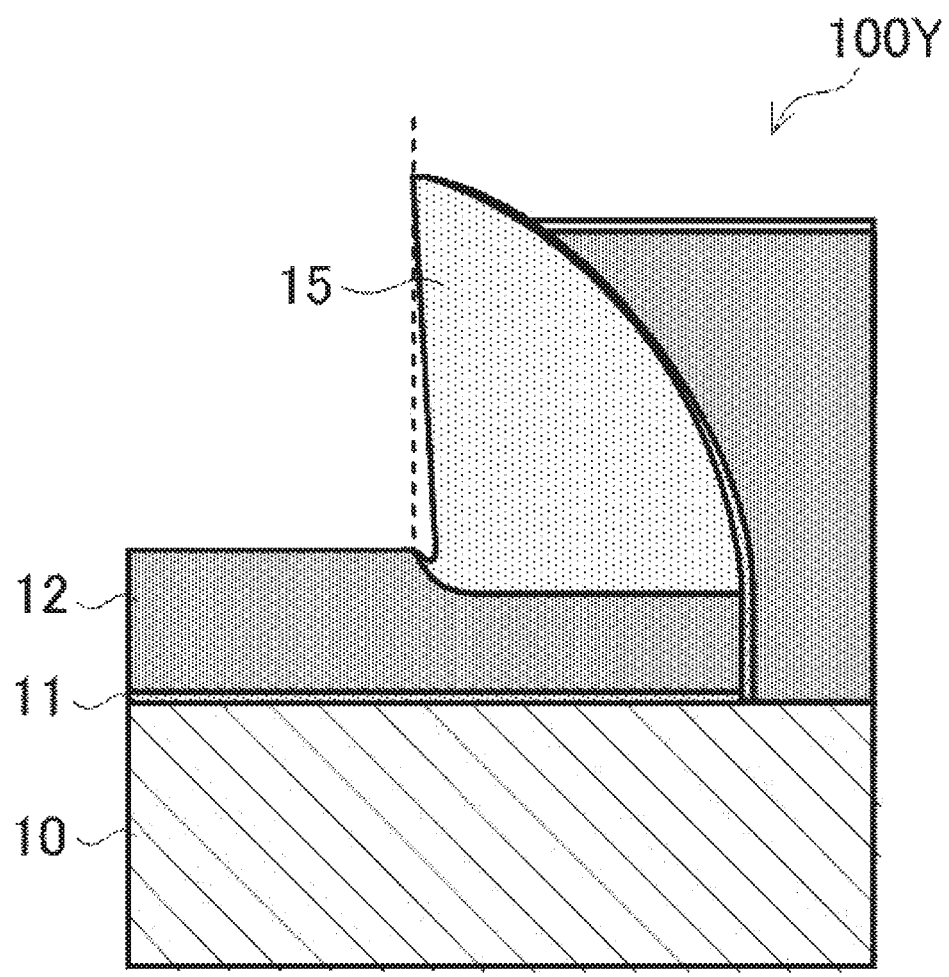
FIG. 7A and FIG. 7B are partial cross-sectional views illustrating a memory cell manufacturing steps according to another comparative example.
Figure 7B:
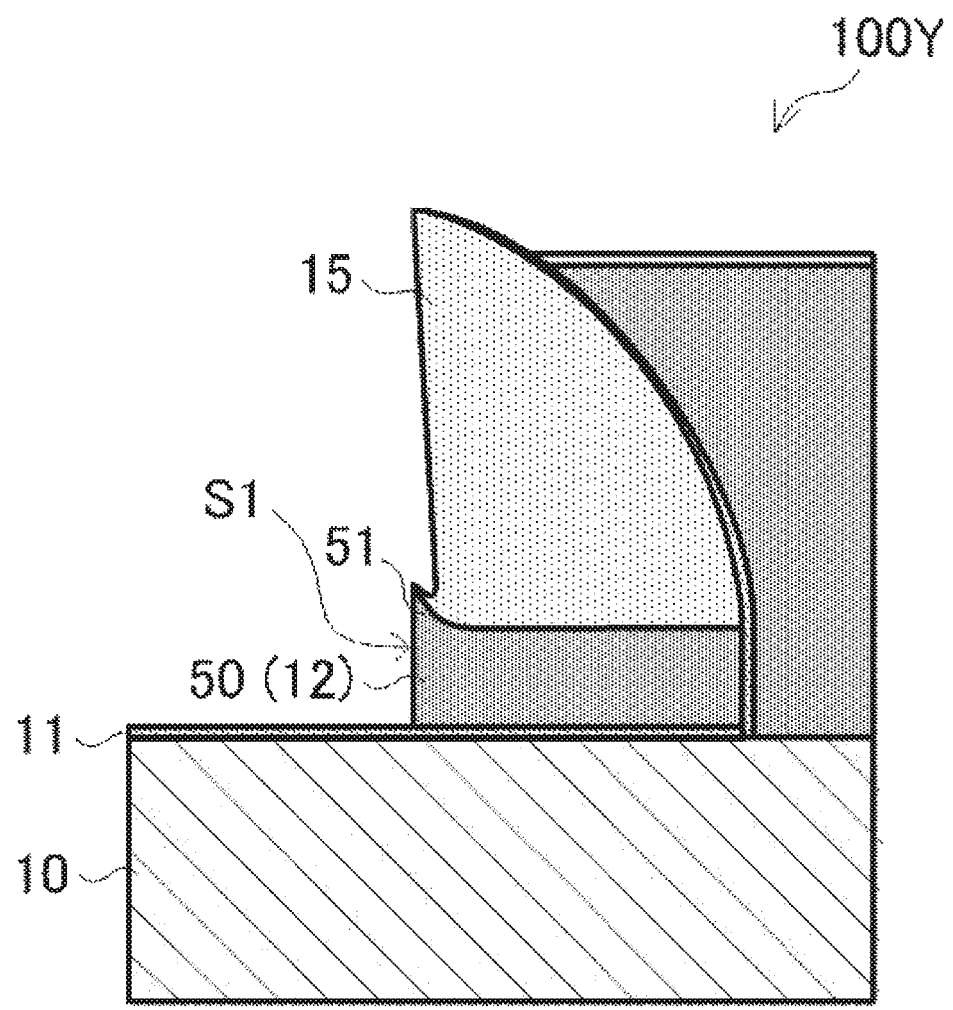

FIG. 7A and FIG. 7B are partial cross-sectional views each illustrating an example of a memory cell 100Y manufacturing step according to a comparative example. The memory cell 100Y according to a comparative example does not have a protective oxidized film 14 in which the memory cell 100A according to the exemplary embodiment has.

As illustrated in FIG. 7A, the side surface of the spacer 15 has a tapered shape spreading upward and is inclined with respect to the main surface of the semiconductor substrate 10. As illustrated in FIG. 7B, when the polysilicon film 12 that configures the floating gate 50 is etched using the spacer 15 having the inclined side surface as the mask, irregularity is formed at an end surface S1 of the floating gate 50, due to the separation between the top portion of the spacer 15 and the polysilicon film 12. Thus the shape of the end portion of the pointed portion 51 varies. Accordingly, extraction of electrons from the floating gate 50 becomes unstable, and the writing/erasing characteristics of the memory cells 100Y become unstable.

Figure 8:
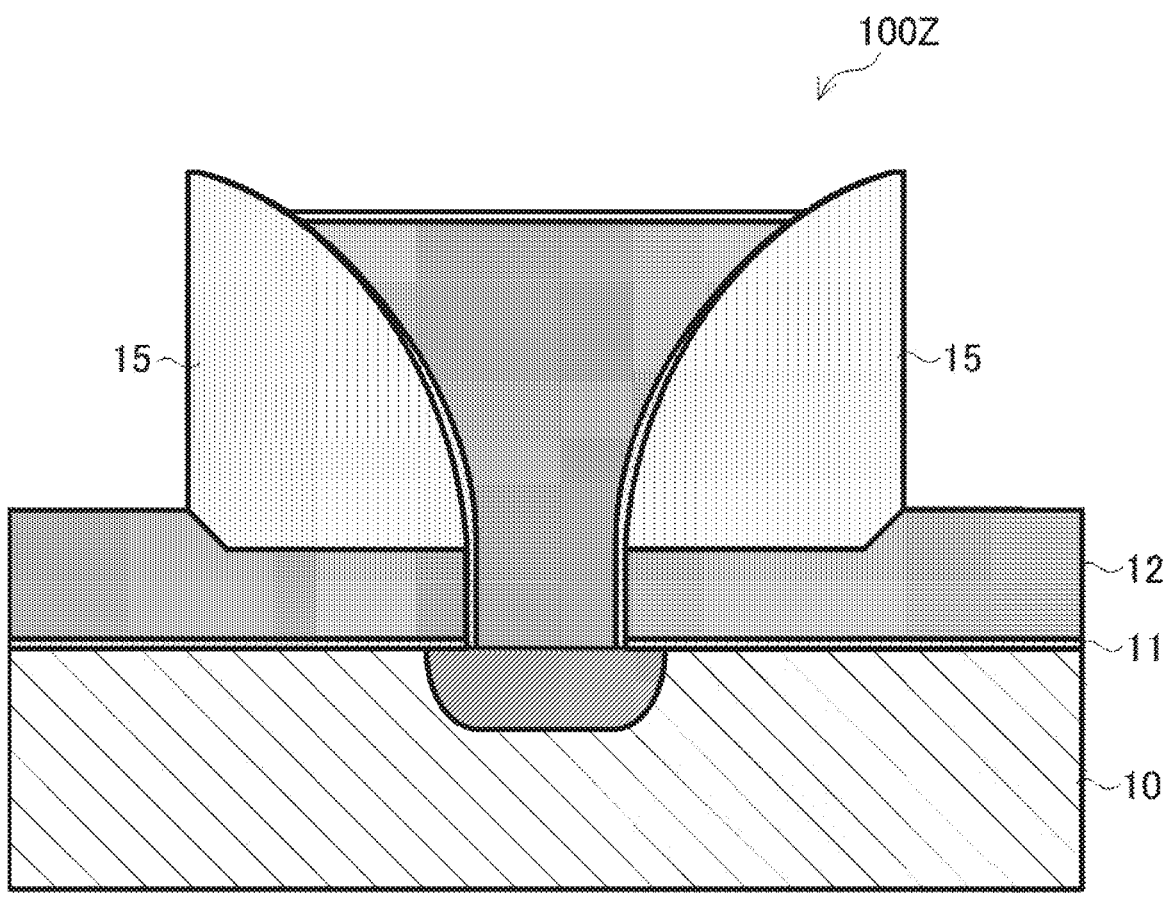
FIG. 8 is a cross-sectional view illustrating a configuration of a memory cell according to the another comparative example.
Figure 9A:
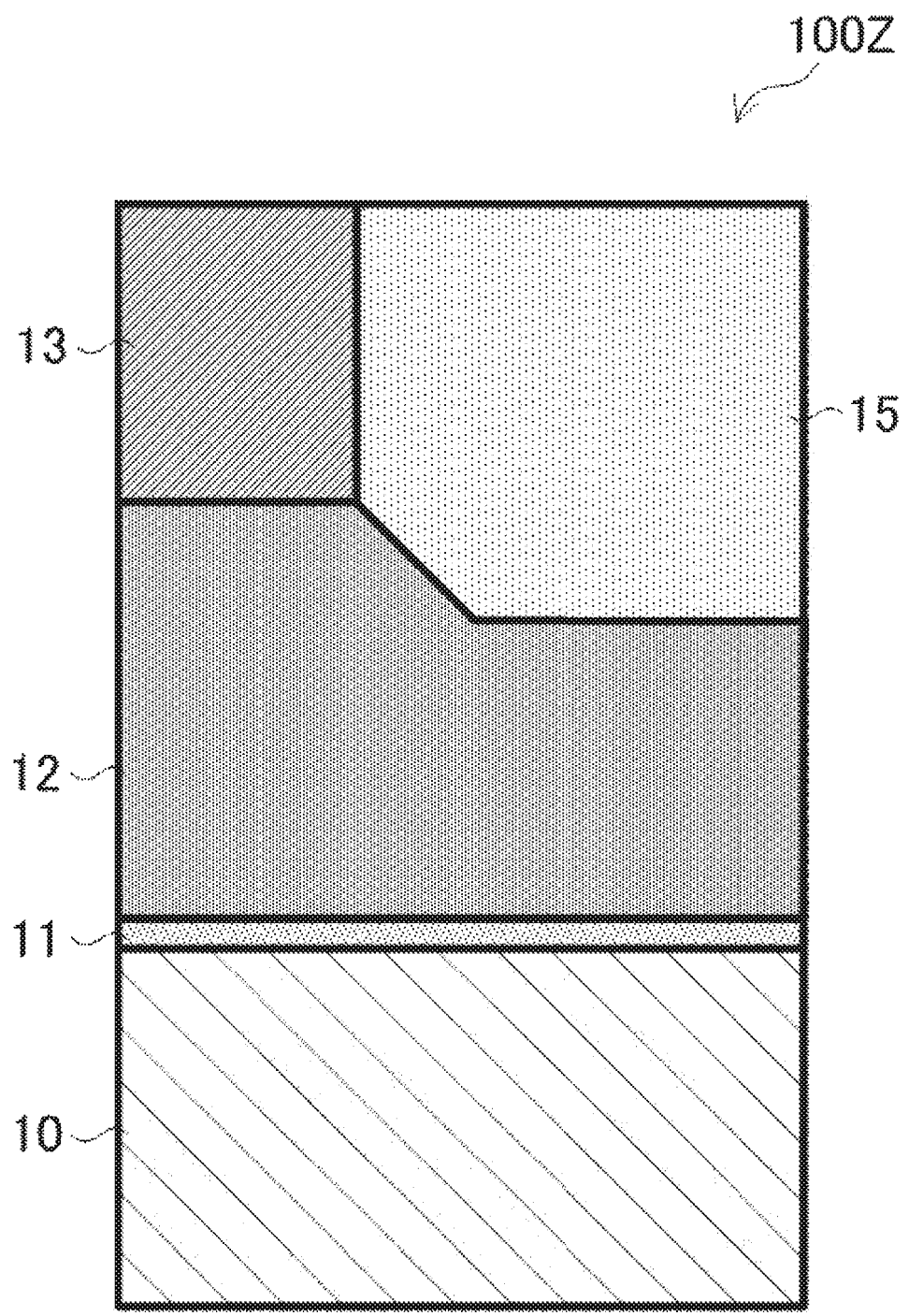
FIG. 9A to FIG. 9D are partial cross-sectional views illustrating a memory cell manufacturing steps according to the another comparative example.
Figure 9B:
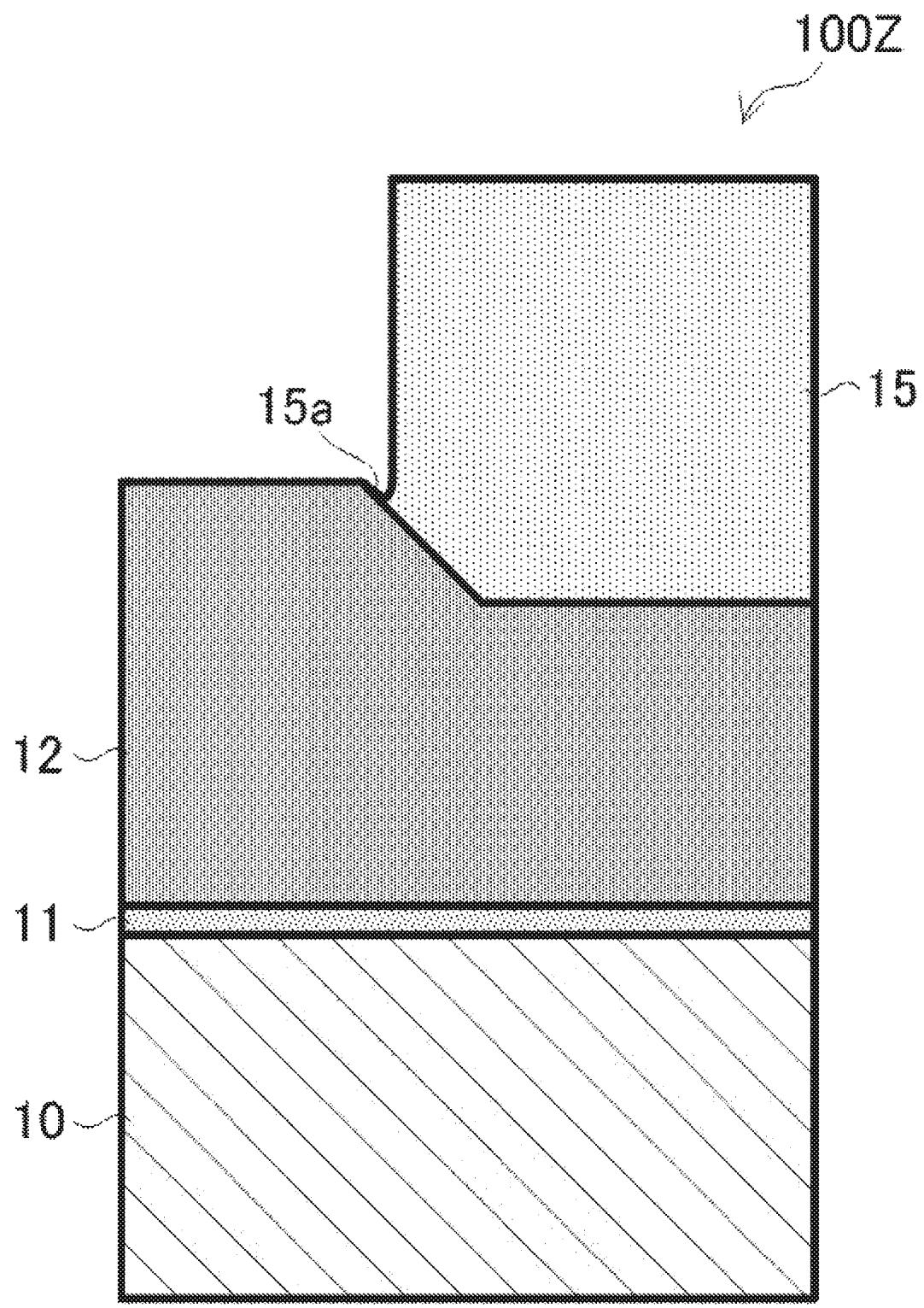
Figure 9C:
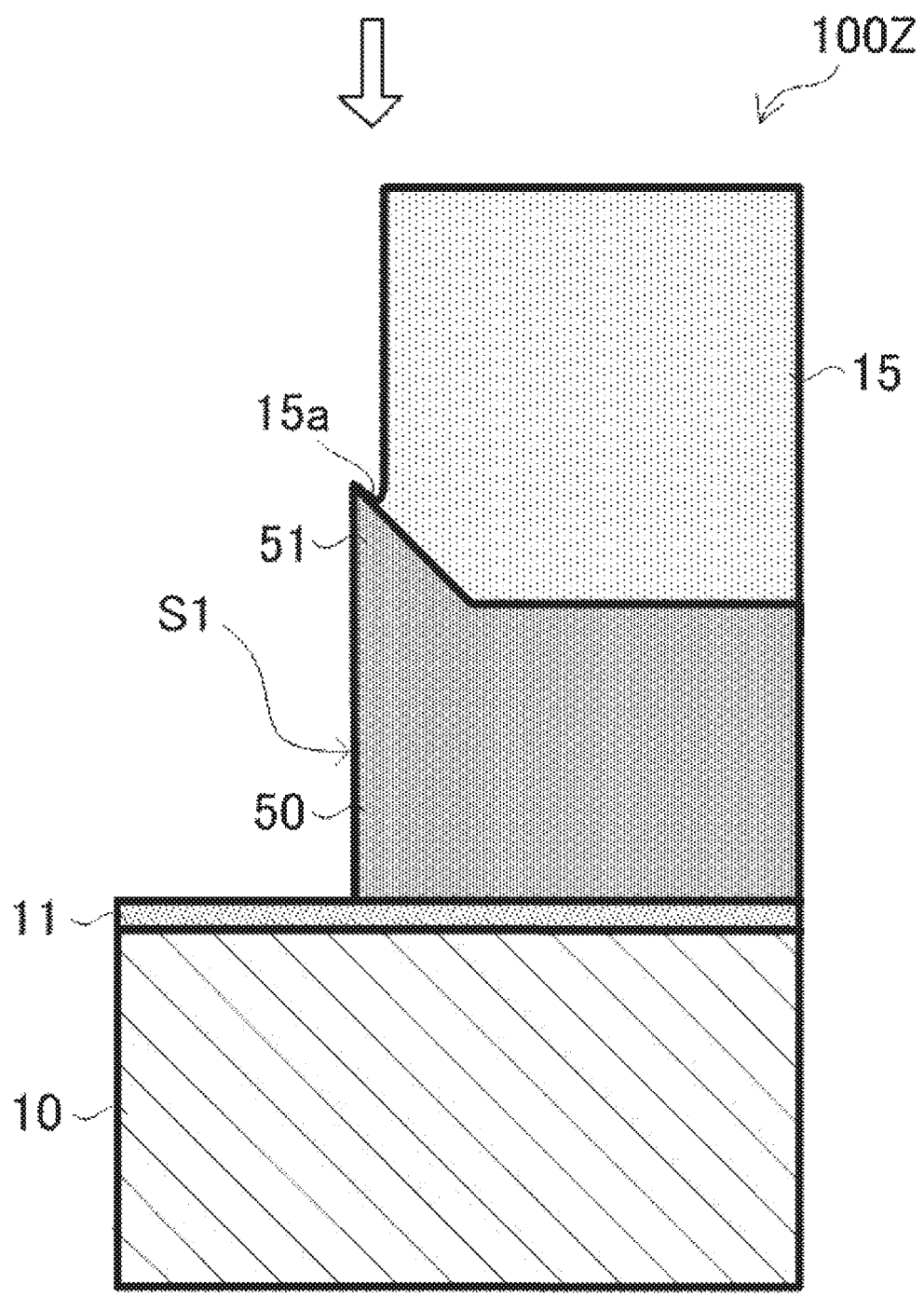
Figure 9D:
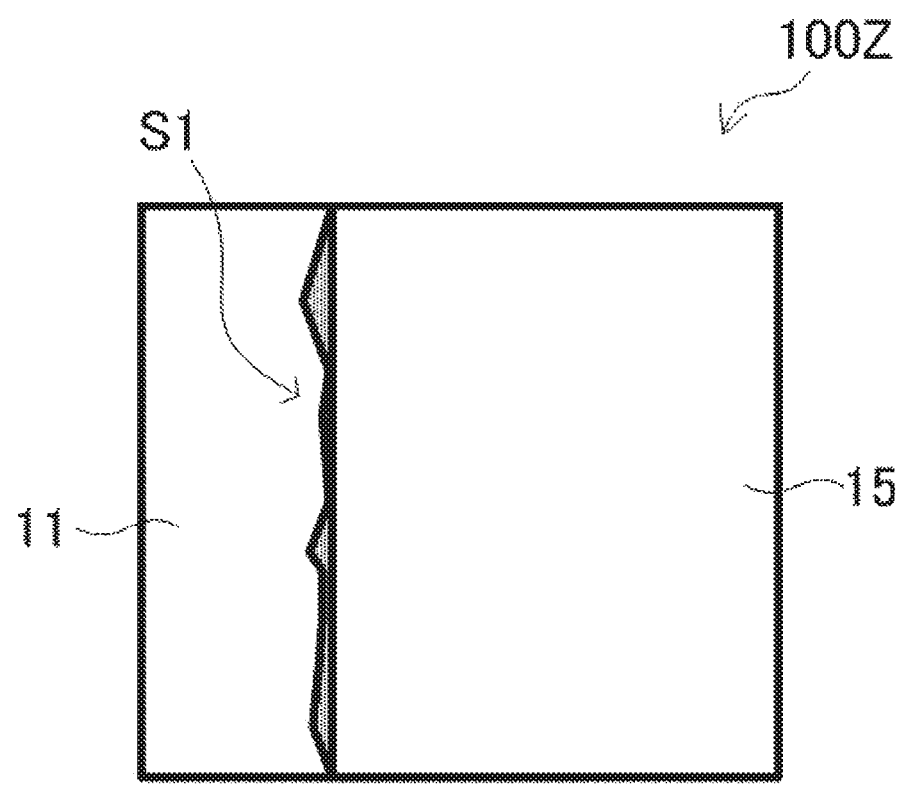

In order to solve the above, as illustrated in FIG. 8, the side surface of the spacer 15 may be provided to be vertical with respect to the main surface of the semiconductor substrate 10 and the space 15 may be tightly contacted with the polysilicon film 12. FIG. 9A to FIG. 9C are partial cross-sectional views each illustrating a manufacturing step of memory cell 100Z according to the comparative example illustrated in FIG. 8. FIG. 9D is a plan view of the memory cell 100Z viewed in a direction of an arrow indicated in FIG. 9C.

According to the memory cell 100Z of the comparative example, the side surface of the spacer 15 is etched and retracted in when removing the nitride film 13, as illustrated in FIG. 9A and FIG. 9B. Accordingly, a rim 15a of the spacer 15 remains at an inclined surface of the polysilicon film 12. Since controlling the shape of the rim 15a is difficult, as illustrated in FIG. 9C and FIG. 9D, when the polysilicon film 12 is pattered by using the spacer 15 including the rim 15a as a mask, the end surface S1 of the floating gate 50 becomes irregular due to the rim 15a of the spacer 15. Accordingly, since the end of the pointed portion 51 has an irregular shape due to the rim 15a, extraction of electrons from the floating gate 50 becomes unstable.

Figure 10A:
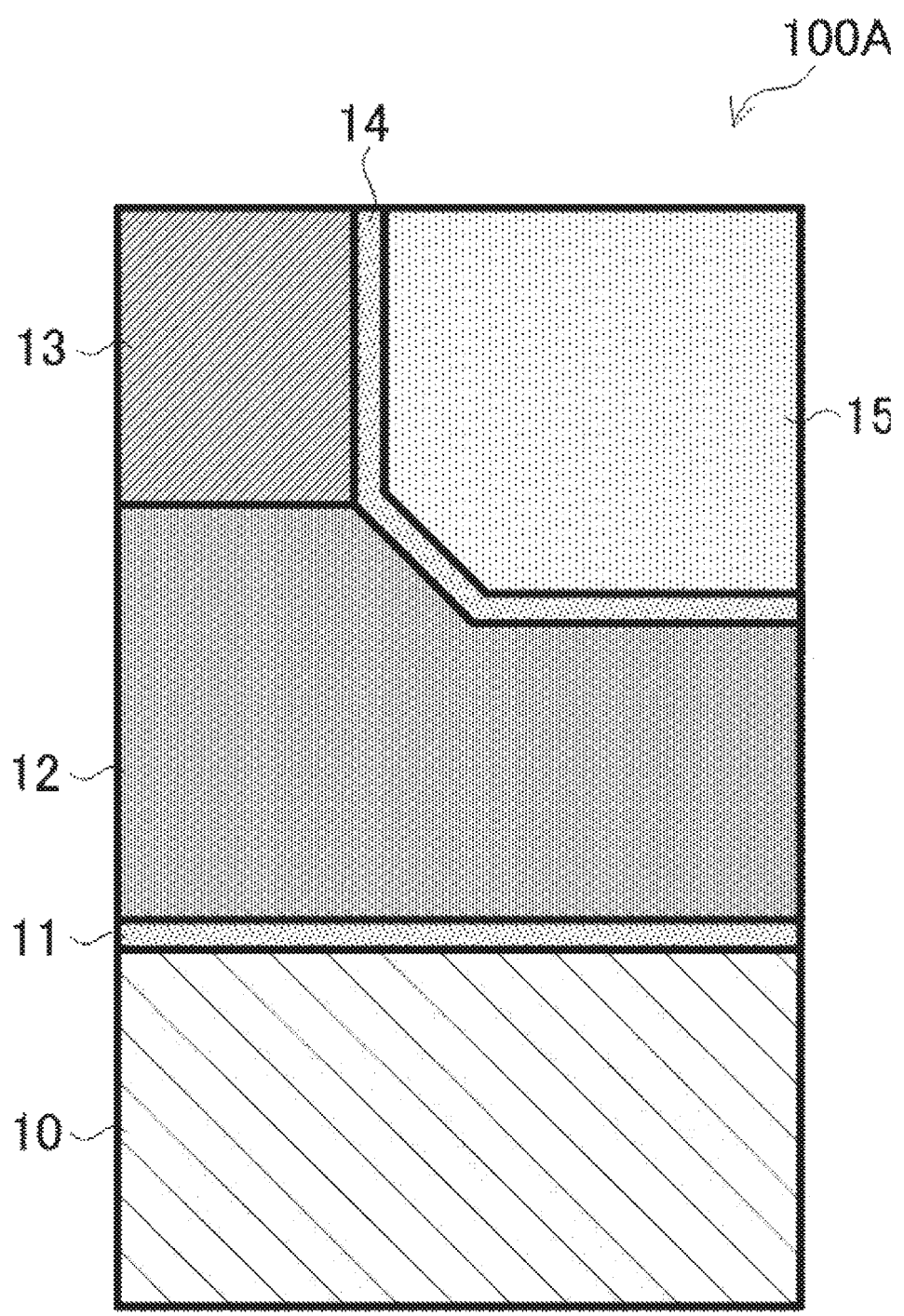
Figure 10B:
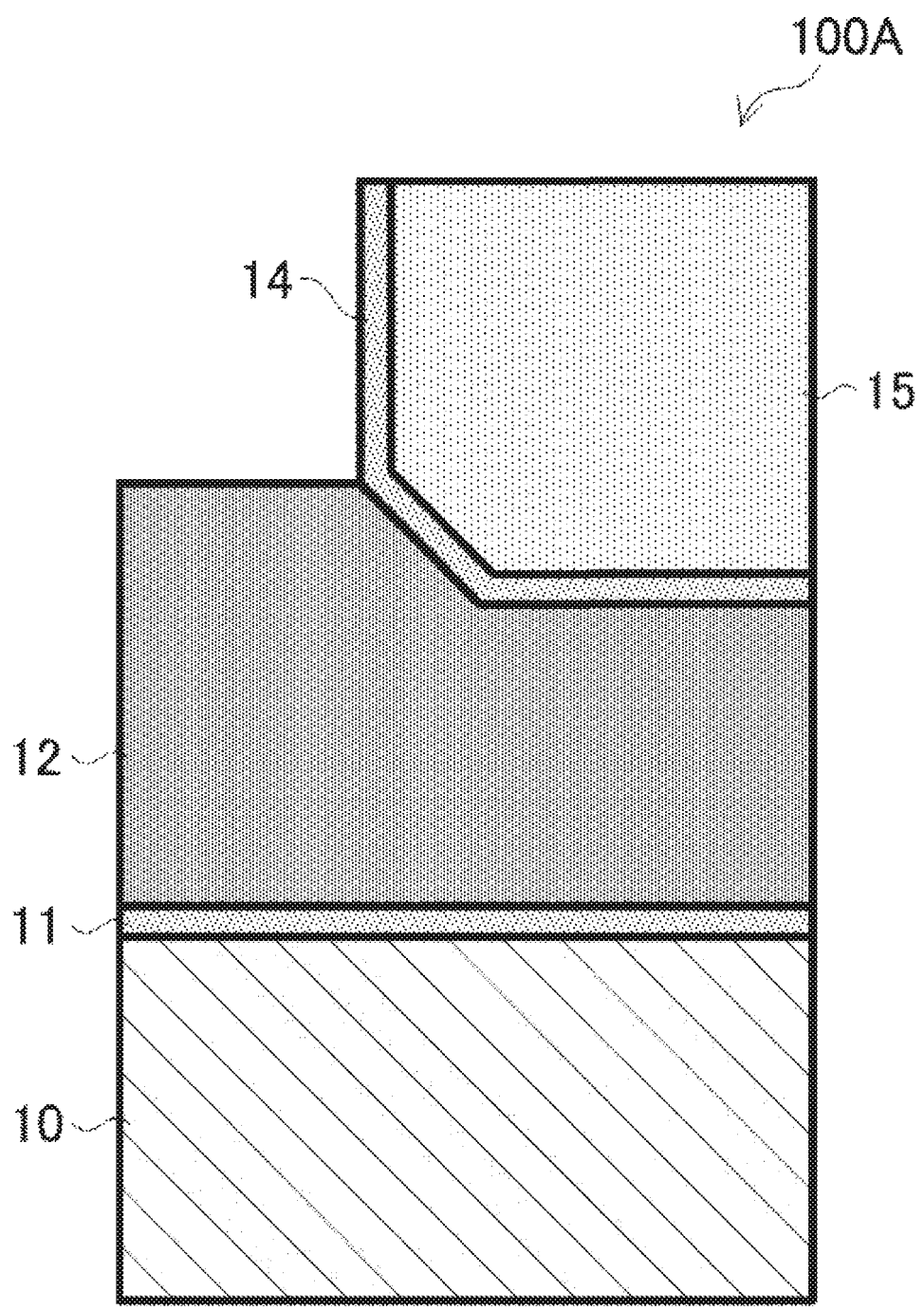
Figure 10D:
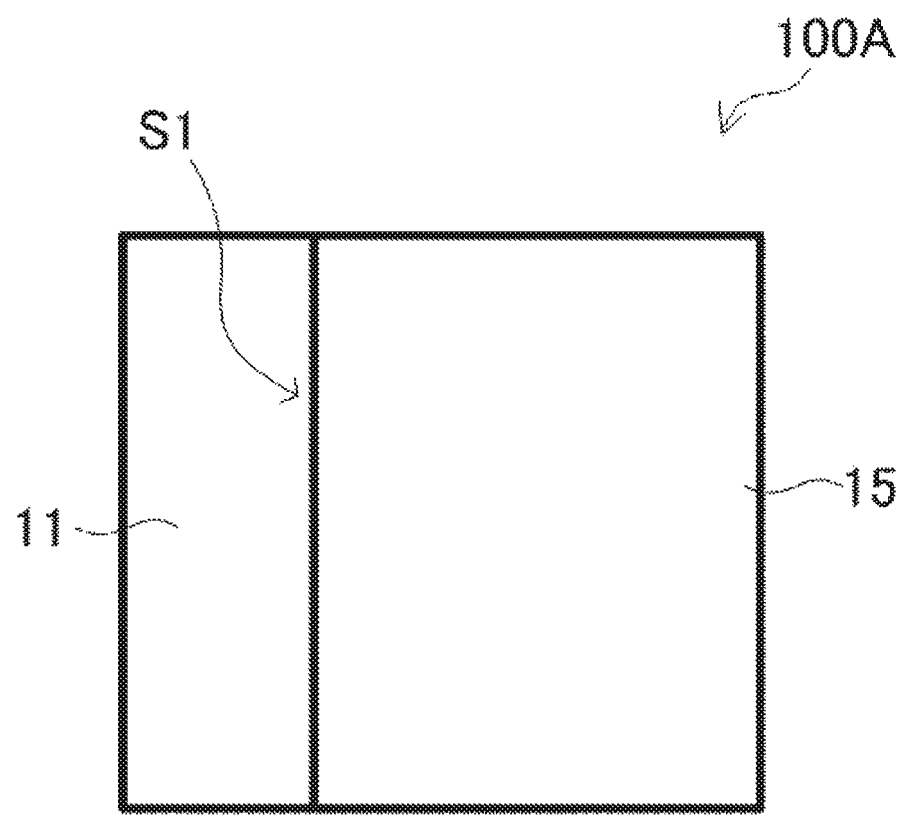

FIG. 10A to FIG. 10C are partial cross-sectional views illustrating a memory cell 100A manufacturing step according to the second exemplary embodiment of the disclosure, and are drawings corresponding to FIG. 9A to FIG. 9C. FIG. 10D is a plan view of the memory cell 100 viewed in a direction of an arrow indicated in FIG. 10C, and is a drawing corresponding to FIG. 9D.

According to the manufacturing method of the memory cell 100A in the present exemplary embodiment, the side surface of the spacer 15 is substantially vertical to the main surface of the semiconductor substrate 10, and is covered with the protective oxidized film 14 as illustrated in FIG. 10A. By applying heat treatment, the protective oxidized film 14 that is entirely densified, has a high resistance against etchant for removing the nitride film 13. Thus the film thickness at the time of film formation is maintained, even in a case in which etching of the nitride film 13 is performed as illustrated in FIG. 10B. In a case in which the polysilicon film 12 is etched by using the spacer 15 having a side surface vertical with respect to the main surface of the semiconductor substrate 10 and the protective oxidized film 14 that covers the side surface of the spacer 15 as masks, an end surface S1 of the floating gate 50 exposed by etching as a shape becomes flat due to the surface shape of the protective oxidized film 14 as illustrated in FIG. 10C and FIG. 10D. Therefore, since irregularity is not formed at the end of the pointed portion 51, extraction of electrons from the floating gate 50 may stabilized, and writing/erasing characteristics of the memory cell 100A may be stabilized.

Note that the gate insulation film 11 is an example of the first insulation film of the present disclosure. The protective oxidized film 14 is an example of a second insulation film of the present disclosure. The tunnel insulation film 17 is an example of the third insulation film of the present disclosure. The insulation film 16 is an example of the fourth insulation film of the present disclosure. The source wiring 31 is an example of the conductive member in the present disclosure. The polysilicon film 12 is an example of the gate member in the present disclosure. The nitride film 13 is an example of a mask member according to the present disclosure.

What is claimed is:

1. A semiconductor device including a memory cell, the memory cell comprising:
   a floating gate provided at a semiconductor substrate with a first insulation film in between, and including a pointed portion having a pointed end at one end side;
   a spacer provided at the floating gate;
   a second insulation film provided between the floating gate and the spacer, and that covers a side surface of the spacer at the one end side; and
   a control gate that contacts a side surface of the floating gate at the one end side via a third insulation film, and that contacts the side surface of the spacer at the one end side via the second insulation film and the third insulation film,
   wherein an end portion of the pointed portion forms an edge that does not depend on a crystalline particle in a material that forms the floating gate,
   the side surface of the spacer at the one end side is vertical with respect to a main surface of the semiconductor substrate, and
   a surface of a portion of the second insulation film covering the side surface of the spacer at the one end side, and the side surface of the floating gate at the one end side, extend in an identical plane.

2. The semiconductor device according to claim 1, wherein the end portion of the pointed portion contacts the control gate via the second insulation film and the third insulation film.

3. The semiconductor device according to claim 1, wherein a density of the second insulation film is higher than a density of the spacer.

4. The semiconductor device according to claim 1, further comprising:

a diffusion layer provided at a surface of the semiconductor substrate; and
   a conductive member, connected to the diffusion layer, that contacts with side surfaces of the floating gate and the spacer at another side other than the one end side via a fourth insulation film.

5. The semiconductor device according to claim 4, wherein the memory cell and another memory cell including an identical configuration to the memory cell are disposed symmetrically about the diffusion layer and the conductive member, with the diffusion layer and the conductive member interposed in between.

6. A semiconductor device manufacturing method comprising:
   forming a gate member at a surface of a semiconductor substrate with a first insulation film in between;
   forming a mask member including an opening at a surface of the gate member, the opening exposing a portion of the gate member;
   forming a second insulation film at a side surface of the opening and the surface of the gate member exposed through the opening;
   forming a spacer inside the opening, the spacer being in contact with the side surface of the opening and the surface of the gate member via the second insulation film;
   removing the mask member by etching; and
   forming a floating gate by etching the gate member using the spacer and the second insulation film as masks,
   wherein the second insulation film has a higher resistance against an etchant used for etching of the mask member than the spacer,
   the second insulation film is a silicon dioxide film formed by a chemical vapor deposition (CVD) method,
   the side surface of the spacer at one end side of the floating gate is vertical with respect to a main surface of the semiconductor substrate, and
   a surface of the portion of the second insulation film that covers the side surface of the spacer at the one end side, and the side surface of the floating gate at the one end side, extend in an identical plane.

7. The semiconductor device manufacturing method according to claim 6, further comprising performing a heat treatment to the second insulation film.

8. The semiconductor device manufacturing method according to claim 6, further comprising:
   forming a concave portion at the surface of the gate member exposed at the opening, before forming the second insulation film, the concave portion including an inclined surface at an end portion,
   wherein the inclined surface is covered with the second insulation film.

9. The semiconductor device manufacturing method according to claim 8, wherein a pointed portion including the inclined surface is formed at one end side of the floating gate by the etching of the gate member.

10. The semiconductor device manufacturing method according to claim 9, further comprising:
    forming a third insulation film that covers a portion of the second insulation film that covers a side surface of the spacer at the one end side, and that covers a side surface of the floating gate at the one end side; and
    forming a control gate that contacts with the side surface of the floating gate at the one end side via the third insulation film, and that contacts with the side surface of the spacer at the one end side via the second insulation film and the third insulation film.

\* \* \* \* \*